(12) United States Patent
Shahri et al.

(10) Patent No.: US 10,221,649 B2
(45) Date of Patent: Mar. 5, 2019

(54) SYSTEMS AND METHODS FOR INTELLIGENT DIVERSION DESIGN AND APPLICATION

(71) Applicant: Weatherford Technology Holdings, LLC, Houston, TX (US)

(72) Inventors: Mojtaba Pordel Shahri, Houston, TX (US); Clayton S. Smith, Edmonton (CA); Francisco E. Fragachan, Houston, TX (US); Ovunc Mutlu, Houston, TX (US)

(73) Assignee: Weatherford Technology Holdings, LLC, Houston, TX (US)

( * ) Notice: Subject to any disclaimer, the term of this patent is extended or adjusted under 35 U.S.C. 154(b) by 404 days.

(21) Appl. No.: 14/931,664

(22) Filed: Nov. 3, 2015

(65) Prior Publication Data

US 2017/0124228 A1    May 4, 2017

(51) Int. Cl.
  *E21B 33/13* (2006.01)
  *E21B 43/26* (2006.01)
  *G06F 17/50* (2006.01)
  *C09K 8/42* (2006.01)

(52) U.S. Cl.
  CPC ............ *E21B 33/13* (2013.01); *E21B 43/261* (2013.01); *G06F 17/5009* (2013.01); *C09K 8/426* (2013.01)

(58) Field of Classification Search
  CPC ..... G06F 17/5009; C09K 8/426; E21B 33/13; E21B 43/261
  See application file for complete search history.

(56) References Cited

U.S. PATENT DOCUMENTS

| | | | |
|---|---|---|---|
| 5,835,882 A | 11/1998 | Vienot et al. | |
| 7,380,600 B2* | 6/2008 | Willberg | C09K 8/42 |
| | | | 166/280.1 |
| 7,380,602 B2* | 6/2008 | Brady | C09K 8/52 |
| | | | 166/282 |
| 2005/0000690 A1* | 1/2005 | Boney | E21B 43/267 |
| | | | 166/280.2 |
| 2005/0183858 A1 | 8/2005 | Ayoub et al. | |
| 2009/0071657 A1 | 3/2009 | Johnson | |
| 2010/0313645 A1 | 12/2010 | Doman et al. | |
| 2013/0341030 A1 | 12/2013 | Brannon et al. | |
| 2014/0318793 A1 | 10/2014 | van Petergem et al. | |

(Continued)

OTHER PUBLICATIONS

LaFond, P. "Particle Jamming During the Discharge of Fluid-Driven Granular Flow" Thesis, Colorado School of Mines (2014) (Year: 2014).*

(Continued)

*Primary Examiner* — Jay Hann
(74) *Attorney, Agent, or Firm* — Blank Rome, LLP

(57) ABSTRACT

The disclosure pertains to the design and implementation of a diversion procedure for geologic openings. Embodiments involve performing a screening analysis to determine if a well or formation is appropriate for stimulation. If a well is appropriate, a modeling analysis is performed to determine candidate parameters for a diversion procedure. The analysis is divided into two segments, a dry analysis of jamming and a wet and full-physics-based analysis of plugging. The jamming analysis provides candidates to the plugging analysis to reduce the work of the more intensive wet full-physics modeling.

31 Claims, 14 Drawing Sheets

(56) References Cited

U.S. PATENT DOCUMENTS

2015/0300131 A1    10/2015   Viderman et al.

OTHER PUBLICATIONS

Hager, A., et al. "Parallel Open Source CFD-DEM for Resolved Particle-Fluid Interaction" Ninth Int'l Conf. on CFD in Minerals & Process Ind., CSIRO (2012) (Year: 2012).*
Harrison, N.W., "Diverting Agents-History and Application" (1972) (Year: 1972).*
Glasbergen, G., et al. "Design and Field Testing of a Truly Novel Diverting Agent" Society of Petroleum Engineers, SPE 102606 (2006) (Year: 2006).*
Weatherford; Refracturing Services and Technologies; "Improving Reservoir Access Through Refracture Treatments"; www.weatherford.com; copyrighted 2014; pp. 1-4.
Weatherford; Fracturing Services; "TBlockSure—Diverting Agent and Stimulation Enhancer—Improving stimulation in new and refractured wells with superior temporary zonal isolation and mechanical diversion"; www.weatherford.com; copyrighted 2015; pp. 1-8.
Int'l Search Report and Written Opinion in counterpart PCT Appl. PCT/US16/58698, dated Jan. 1, 2017, 8-pgs.

\* cited by examiner

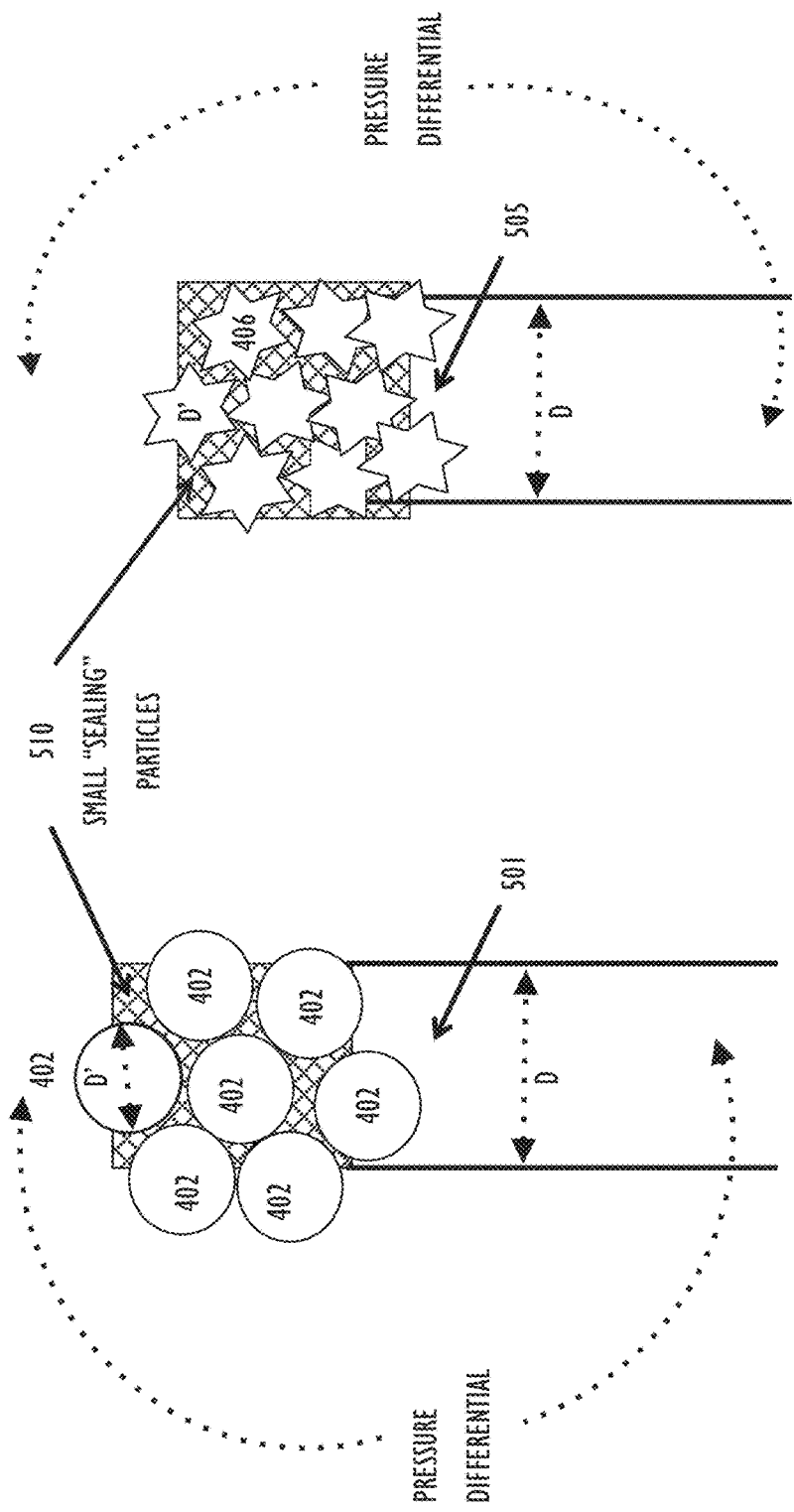

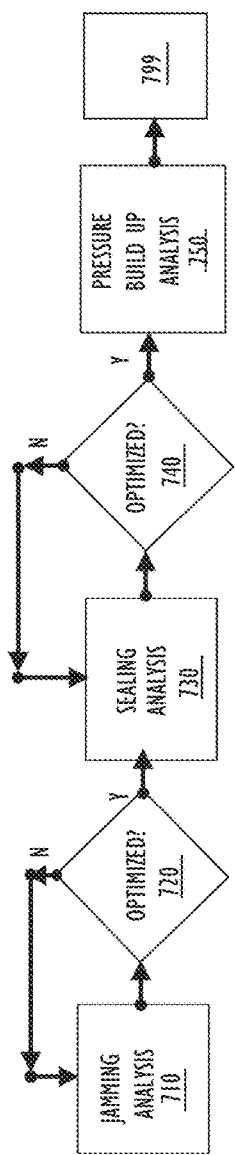
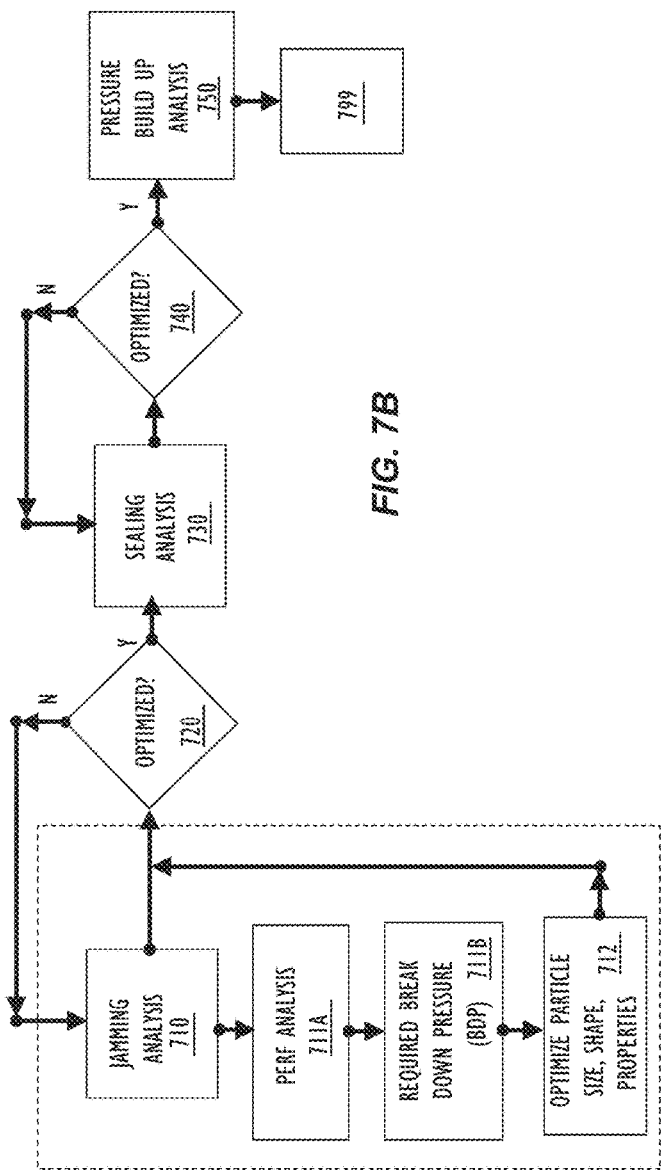
FIG. 7A
FIG. 7B

SYSTEMS AND METHODS FOR INTELLIGENT DIVERSION DESIGN AND APPLICATION

BACKGROUND

The inventions disclosed herein relate to the field of fluid flow diversion by use of mechanical blocking agents, such as degradable, solid-particle diverting agents. One particular example of products in this field is Weatherford International's TBLOCKSURE® product line. At the time of this filing, TBLOCKSURE® is a trade name given to a suite of self-degradable, polymer-based, temporary diversion materials that are useful in a number of Oil and Gas operations, primarily to facilitate the flow of fluids into areas of the reservoir where they would not normally go based upon fluid dynamics. Fluids that are introduced into a reservoir, for purposes such as stimulation, typically take the path of least resistance and therefore will frequently go into areas where there are open flow paths. These areas of least resistance are not necessarily the areas targeted for stimulation and/or treatment (e.g., to increase production or target formation damage). To counteract this phenomenon of fluid flowing in the path of least resistance, mechanical diversion techniques may be employed. However, a variety of factors, including production need, regulatory requirements, or environmental concerns may necessitate the physical removal of the mechanical diversions. The phenomenon may also be counteracted through the use of temporary degradable diversion systems, for example blocking agents that degrade with time, heat, pressure, or other natural or augmented treatment. These temporary degradable diversions work well for zonal isolation and do not need to be removed (e.g., from a well) mechanically after the intervention since they are capable of degrading (e.g., with time) from a solid polymer state into a fluid, such as a clear non-damaging liquid monomer solution.

The chemistries used for degradable diversions, such as TBLOCKSURE® product chemistries, may be designed to exhibit a variation of jamming, plugging, and degrading properties. For example, diversion agents may be capable of degrading across a wide temperature range to monomer species that will not damage a hydrocarbon bearing formation. In addition, diversion agents may be designed to accommodate significant temperature variations (e.g., from 80° F. up to 325° F.) with variable degradation times (e.g., between a few hours to a few days). This may be achieved, for example, through the selection of polymer chemistry, shape, size, or other particle parameter.

However, despite the useful design of these various degradable polymers, the successful deployment and use of this technology in the field (e.g., as a temporary diverter) is heavily dependent upon optimization that contemplates engineering and geo-mechanical design as it relates to the particulars of the environment. In simpler words, the potential of modern degradable diversion agents is extremely limited in the absence of timely-created workflows and processes that contemplate, in correct proportions, job-specific factors as well as historical field data, experimental data, modeling, and specifically beneficial mathematical analysis.

SUMMARY

In any application where fluid paths are employed, there may be a need or desire to divert fluid around openings that might undesirably absorb fluid flow. These applications may include hydrocarbon production operations such as drilling, fracturing, or stimulating wells, but they may also include any processes where the control of fluid flow is useful. Therefore, applications of the embodiments herein may reach fluid flow in any context such as in natural formations, man made formations, man-made facilities (e.g., conduits or casings of any kind), or any combination of the foregoing.

In some embodiments, the major mechanisms controlling the success of the diversion process can be divided into two main subcategories of jamming and plugging. In an exemplary embodiment, a first phase of the diversion process may include the formation of a stable jammed structure. This structure may form the base for an effective plugging mechanism. In a second phase of an example embodiment, a plug may be formed over and/or within the jam to limit or extinguish the flow paths that exist in the jammed structure. Thus, a fluid diversion is created.

Many embodiments of the present disclosure relate to customized processes using engineered diverting agents (e.g., TBLOCKSURE®) for jamming and subsequent plugging of openings such as exiting perforations, natural fractures, or fissures or openings in rock or geographic formations of any kind. Among many potential applications, these embodiments may have implications to hydrocarbon production operations, acidizing, multi-stage hydraulic fracturing, fracturing, and refracturing of geologic formations or man made formations of any kind. In a general embodiment of the disclosure, field data; experimental data; analytical functions or models; and numerical functions or models may be used to specify diversion-related parameters, such as optimum particle concentration, optimum particle size, optimum ratio of particle types, pressure build-up and predictions thereof, and/or optimum particle shapes.

Some embodiments of the disclosure propose processes or workflows that combine proprietary proportions of analytical and numerical techniques to optimize the variable constituents of jamming and plugging, such as particle size, particle size distribution (including, without limitation, particle ratio), particle shape, particle concentration, flow rate, and fluid viscosity. In some embodiments, these and potentially other variable parameters may be customized to the target formation and the job-specific goals to ensure effective and efficient plugging of existing openings. For example, an illustrative proposed process or workflow may specify the variable parameters in view of multiple analyses applied in proprietary sequence and/or proportions, where the analyses contemplate the available data in view of the target formation, and to optimize a process or workflow for application of diverting agents. In some embodiments the created workflow or process may be created to most efficiently target a particular pressure build-up capability.

In a current and common application of diversion implementation, a pre-specified ratio of particles may be pumped into the treatment area at a specified rate, while the pressure build-up is either monitored or intermittently checked. If the pressure builds as desired, then no adjustments are made to the process and the diversion is completed after the target pressure is reached. However, if the pressure build-up does not move as desired, typical field behavior may be to simply change particle concentration by pumping more pounds per gallon (for higher desired pressure). In these situations, even if there is a desire to vary other parameters relating to pressure build-up, the field operators are left to essentially guess at solutions because the number of factors is large and the potential changes that may be applied to the diversion operation is virtually infinite.

A process or workflow under one or more embodiments proposed herein may take into account, in appropriate proportions, field data or experimental data yielding formation specific properties so that engineering design can be customized based on data unique to different formations. For example, a sample application concerning a particular fluid path and subject to particular job requirements may require a seal over existing flow pathways where the seal can withstand differential pressures up to a specified psi (e.g., practically sometimes exceeding 6,000 psi). Yet, the job demands may also require the solid particles to completely degrade in a controlled amount of time (e.g., .N hours) after the completion of the intervention. Using the techniques and proposals described herein, a strong diversion plug may be dynamically created, in some embodiments, by using material particle sizes (e.g., 100 mesh-7 mesh) that are smaller than the openings to be sealed (e.g., typically up to 10 mm, but potentially much larger).

Many embodiments herein iteratively employ analytical and numerical functions and modeling, for example to run simulations and obtain the results thereof. In particular, as discussed in further detail below, specifically directed use of coupled Computational Fluid Dynamics (CFD), Discrete Element Methods (DEM), and analytical models may be used to create custom design and implementation criteria and processes for controlling fluid diversion and pressure build-up. In one or more embodiments, the analytical models may be calibrated with both experimental data and field data in order to enhance the customization of the diversion techniques employed.

Varying embodiments of the disclosure may use modeling engines, which may incorporate different scenarios so that the factors affecting diversion efficiency may be optimized. By designing, in correct and proprietary proportions, the application of chemistries, particle shapes and sizes, as well as pressure, temperature, and other parameters, a diversion operation may be engineered and/or customized for the best result in each fluid path. For example, each diversion operation may be customized to the particular hydrocarbon formation, a particular well, or even a particular segment or branch of a well. This customization with data unique to each local environment (e.g., depth, mechanical properties, fracture breakdown pressures, etc.) may provide efficient and robust plugging and jamming procedures and results. For example, different parameters, such as particle size, shape, concentration, ratio, flow rate, etc., may be optimized to achieve a desired diversion (e.g., during re-fracturing processes or other well born operations).

BRIEF DESCRIPTION OF THE DRAWINGS

FIGS. 5A and 5B show illustrations of jamming and plugging.

FIGS. 7A, 7B, 7C, 7D, 7E, and 7F show processes or workflows in accordance with one or more embodiments.

DETAILED DESCRIPTION

Figure 1:
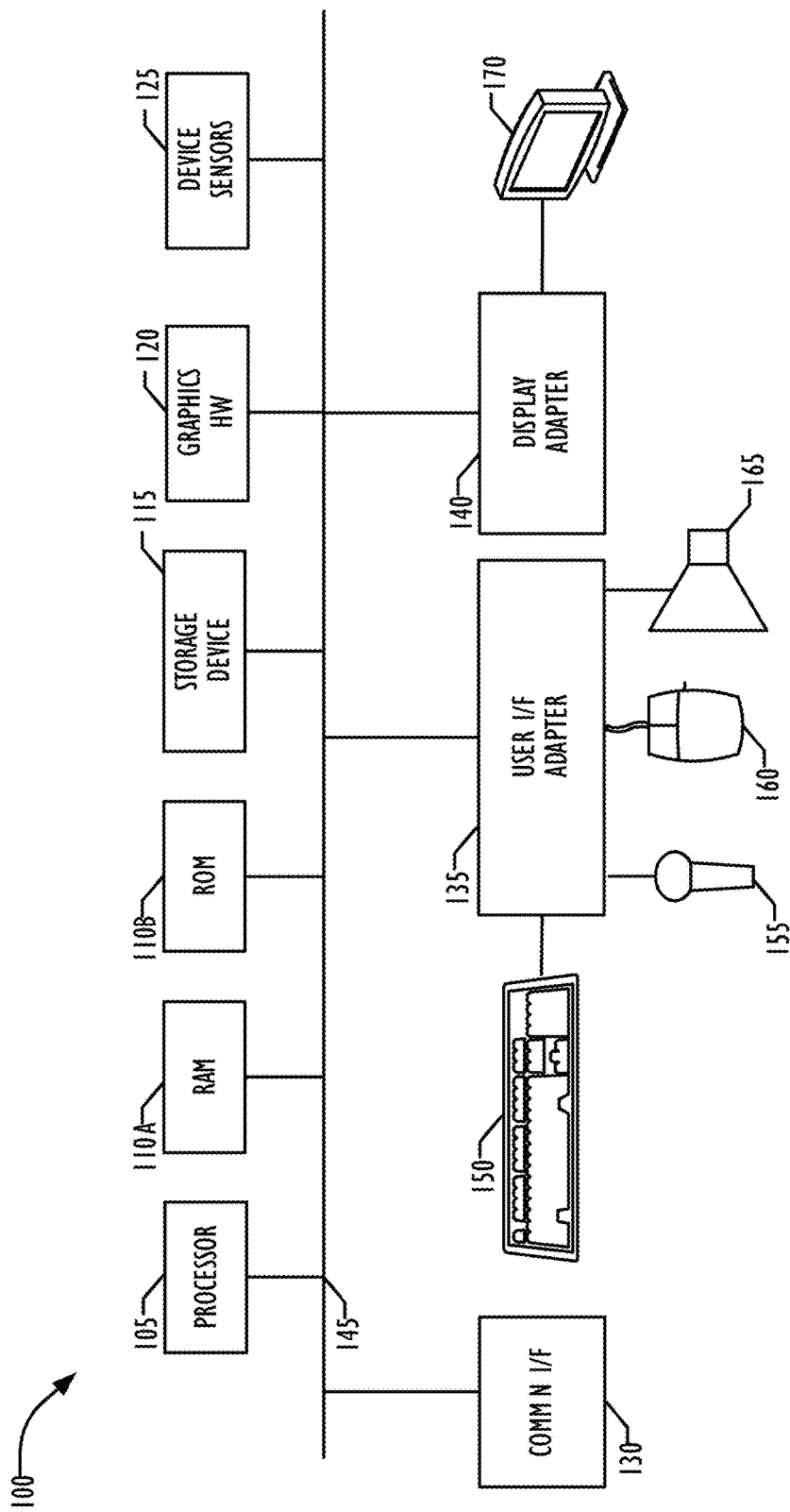
FIG. 1 shows a representative computer node that may be used, for example, as an end-user machine or a developer machine.

This disclosure pertains to systems, tools, machinery, methods, and computer-readable media pertaining to an intelligent and staged design and application of fluid path diversion in geological structures. In particular, many embodiments of the invention relate to processes and workflows embodying stimulation engineering optimization design. Further, some embodiments relate to the use of oil field tools, including mechanical and fluid dynamic tools in conjunction with analysis and design flow that is computer aided or computer implemented. In some embodiments, there is envisioned an automated intelligent workflow or process with limited human involvement whereby oil field equipment and resources are directed by intelligent computer control, which uses dynamically gathered-on-site information along with field data and specified types of modeling and analysis to direct or control the creation and maintenance of diversion systems in fluid passageways, such as wells.

In the following description, for purposes of explanation, numerous specific details are set forth in order to provide a thorough understanding of the disclosed concepts. As part of this description, some of this disclosure's drawings represent structures and devices in block diagram form in order to avoid obscuring the novel aspects of the disclosed concepts. In the interest of clarity, not all features of an actual implementation are described. Moreover, the language used in this disclosure has been principally selected for readability and instructional purposes, and may not have been selected to delineate or circumscribe the inventive subject matter, leaving resorting to the claims as a potential necessity to determine such inventive subject matter. Reference in this disclosure to "one embodiment" or to "an embodiment" or "embodiments" means that a particular feature, structure, or characteristic described in connection with the embodiment is included in at least one embodiment of the disclosed subject matter, and multiple references to "one embodiment" or "an embodiment" should not be understood as necessarily all referring to the same embodiment. Furthermore, unless otherwise stated, use of the word "or" herein is intended to state options that may be applied separately or together (i.e., unless otherwise stated, "or" herein does not indicate a mutually exclusive choice).

It will be appreciated that in the development of any actual implementation (as in processes, machinery, tools, or any software and/or hardware development project), numerous decisions must be made to achieve the developers' specific goals (e.g., compliance with system- and business-related constraints), and that these goals may vary from one implementation to another. It will also be appreciated that such development efforts might be complex and time-consuming, but would nonetheless be a routine undertaking for those having the benefit of this disclosure and being of ordinary skill in the design and implementation of diversion systems and related technologies.

Exemplary Hardware and Software

The inventive embodiments described herein may have implication and use in and with respect to all types of devices, including single- and multi-processor computing systems and vertical devices that incorporate single- or multi-processing computing systems. The discussion herein is made with reference to a common computing configuration that may be discussed as a server, a software development system, or an end-user system. This common computing configuration may have a CPU resource including one or more microprocessors. This discussion is only for illustration regarding sample embodiments and is not intended to confine the application of the invention to the disclosed hardware. Other systems having other known or common hardware configurations (now or in the future) are fully contemplated and expected. With that caveat, a typical hardware and software-operating environment is discussed below. The hardware configuration may be found, for example, in a server, a workstation, a laptop, a tablet, a desktop computer, a gaming platform (whether or not portable), a television, an entertainment system, a smart phone, a phone, or any other computing device, whether mobile or stationary.

Referring to FIG. 1, the disclosed embodiments may be performed by representative computer system 100. For example, the representative computer system may act as a server, a software development platform, or an end-user device. System 100 may be embodied in any type of device, such as a general purpose computer system, a television, a set top box, a media player, a multi-media entertainment system, an image processing workstation, a hand-held device, or any device that provides software services to users and/or other computers. Computer system 100 may include one or more processors 105, memory 110 (110A and 110B), one or more storage devices 115, and graphics hardware 120. Computer system 100 may also have or be connected with device sensors 125, which may include one or more of: any known well site or oil field sensor, depth sensors (such as a depth camera), 3D depth sensor(s), imaging devices (such as a fixed and/or video-capable image capture unit), RGB sensors, proximity sensors, ambient light sensors, accelerometers, gyroscopes, any type of still or video camera, LIDAR devices, SONAR devices, microphones, CCDs (or other image sensors), infrared sensors, thermometers, etc. These and other sensors may work in combination with one or more GPUs, DSPs, or conventional microprocessors along with appropriate programming so the sensor outputs may be properly interpreted and/or combined and interpreted.

Returning to FIG. 1, system 100 may also include communication interface 130, user interface adapter 135, and display adapter 140—all of which may be coupled via system bus or backplane 145. Memory 110 may include one or more different types of media (e.g., solid-state, DRAM, optical, magnetic, etc.) used by processor 105 and/or graphics hardware 120. For example, memory 110 may include memory cache, read-only memory (ROM), and/or random access memory (RAM). Storage 115 may include one or more non-transitory storage media including, for example, magnetic disks (fixed, floppy, and removable) and tape, optical media such as CD-ROMs and digital video disks (DVDs), and semiconductor memory devices such as Electrically Programmable Read-Only Memory (EPROM) and Electrically Erasable Programmable Read-Only Memory (EEPROM). Memory 110 and storage 115 may be used to retain media (e.g., audio, image, and video files), preference information, device profile information, computer program instructions organized into one or more modules and written in any desired computer programming language, and any other suitable data. When executed by processor 105 and/or graphics hardware 120, such computer program code may implement one or more of the methods, workflows, or processes described herein. Communication interface 130 may include semiconductor-based circuits and may be used to connect computer system 100 to one or more networks. Illustrative networks include, but are not limited to: a local network, such as a USB network; a business's local area network; and a wide area network, such as the Internet; and may use any suitable technology (e.g., wired or wireless). Communications technologies that may be implemented include cell-based communications (e.g., LTE, CDMA, GSM, HSDPA, etc.) or other communications (Ethernet, Wi-Fi, Bluetooth, USB, Thunderbolt, Firewire, etc.). User interface adapter 135 may be used to connect keyboard 150, microphone 155, pointer device 160, speaker 165, and other user interface devices such as a touchpad and/or a touch screen (not shown). Display adapter 140 may be used to connect one or more display units 170. Communications interface 130 may also be used to exercise external control over outside items, such as pumps, valves, conveyances, motors, notification systems, other computers, storage containers, and anything else that may be controlled by a computer at a well site or in the oil field services industry.

Processor 105 may execute instructions necessary to carry out or control the operation of many functions performed by system 100 (e.g., execution of formulas and modeling software). Processor 105 may, for instance, drive display 170 and receive user input from user interface adapter 135 or any other user interfaces embodied by a system, such as sensor interfaces or networked communication. User interface adapter 135, for example, can take a variety of forms, such as a button, a keypad, a dial, a click wheel, a keyboard, a display screen, and/or a touch screen. Processor 105 may be any type of computing device, such as one or more microprocessors working alone or in combination with GPUs, DSPs, and/or system-on-chip devices such as those found in mobile devices. Processor 105 may include one or more dedicated GPUs or graphics subsystems that accept program instructions to create or alter display information such as pixels. In addition, processor 105 may be based on reduced instruction-set computer (RISC) or complex instruction-set computer (CISC) architectures or any other suitable architecture and may include one or more processing cores. Graphics hardware 120 may be special purpose computational hardware for processing graphics and/or assisting processor 105 in performing computational tasks. In some embodiments, graphics hardware 120 may include CPU-integrated graphics and/or one or more programmable GPUs. System 100 (implementing one or more embodiments discussed herein) can provide the means for one or more users to control the same system (e.g., system 100) or another system (e.g., another computer or entertainment system) through user activity, which may include natural activity and/or predetermined gestures such as hand gestures. For example, a system may use sensors such as cameras to monitor a well site and interpret as input detected human or machine behaviors.

Various embodiments of the invention may employ sensors, such as cameras. Cameras and like sensor systems may include auto-focus systems to accurately capture video or image data ultimately used to interpret user intent or commands. Since the motion of the user may be based upon subtle activity in small regions in the captured images (e.g., hands, fingers, face, mouth, brow etc.) the autofocus system may be used to separately focus on multiple regions of the image in order to access better information.

Returning to FIG. 1, sensors 125 may capture contextual and/or environmental phenomena such as time; location information; the status of the device with respect to light, gravity, and the magnetic north; and even still and video images. In addition, network-accessible information, such as weather information, may also be used as part of the context. All captured contextual and environmental phenomena may be used to provide context to sensed activity or user activity or information about the sensed activity or user activity.

Output from the sensors 125 may be processed, at least in part, by processor 105 and/or graphics hardware 120 and/or a dedicated image processing unit incorporated within or without system 100. Information so captured may be stored in memory 110 and/or storage 115 and/or any storage accessible on an attached network. Memory 110 may include one or more different types of media used by processor 105, graphics hardware 120, and sensors 125 to perform device functions. Storage 115 may store data such as media (e.g., audio, image, and video files); sensor data; computer program instructions; and other software, including database applications (e.g., a database storing field data or historical data), preference information, device profile information, and any other suitable data. Memory 110 and storage 115 may be used to retain computer program instructions or code organized into one or more modules in either compiled form or written in any desired computer programming language. When executed by, for example, processor 105, such computer program code may implement one or more of the acts, functions, or models described herein (e.g., DEM or CFD analysis).

Figure 2:
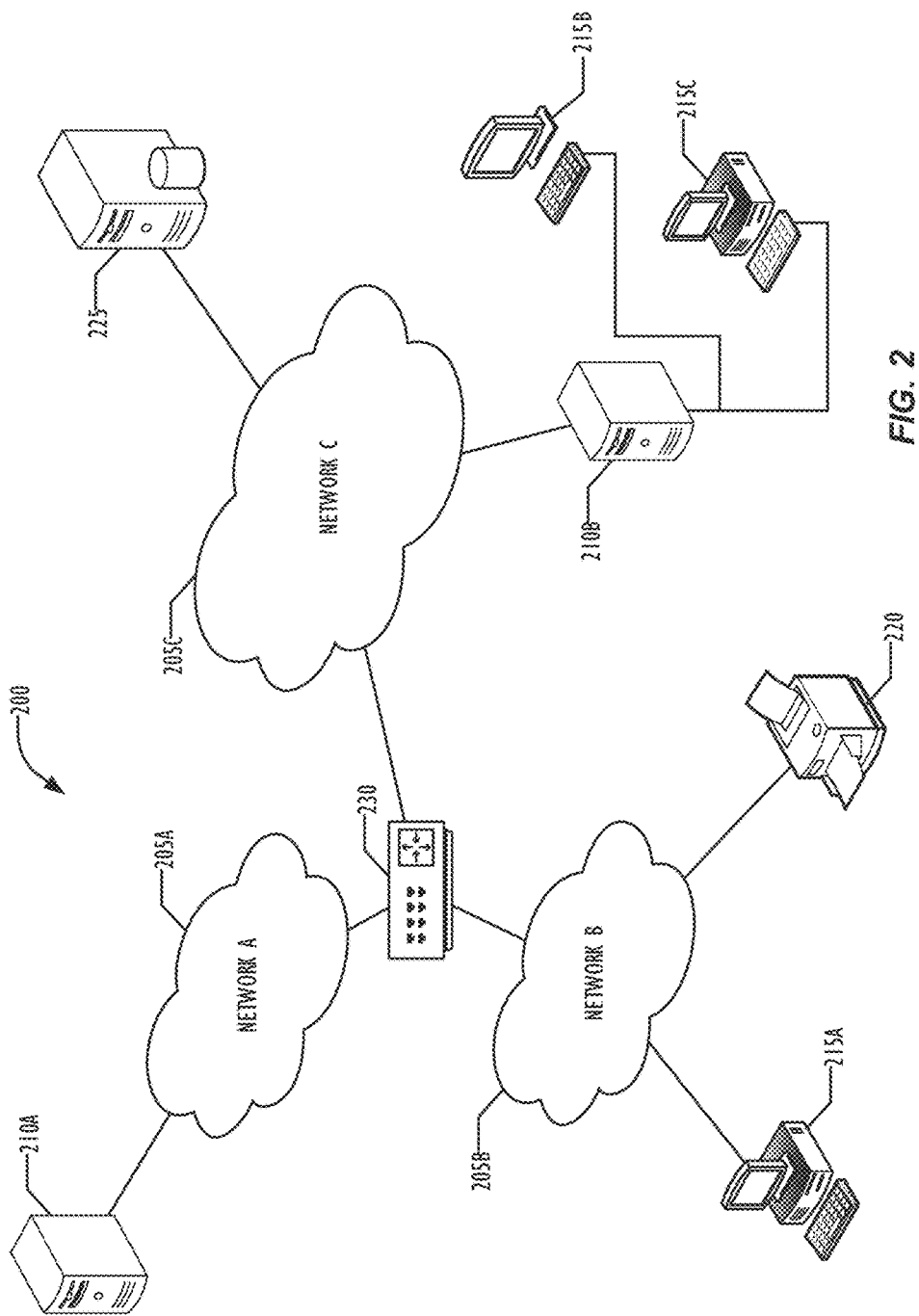
FIG. 2 shows an illustrative network environment associated with embodiments of the invention.

FIG. 2 depicts illustrative network architecture 200, within which the disclosed techniques may be implemented and the disclosed hardware may reside. This illustrative network 200 may include a plurality of networks 205, (i.e., 205A, 205B, and 205C), each of which may take any form including, but not limited to, a local area network (LAN) or a wide area network (WAN), such as the Internet. Further, networks 205 may use any desired technology (wired, wireless, or a combination thereof) and protocol (e.g., transmission control protocol, TCP). Coupled to networks 205 are data server computers 210 (i.e., 210A and 210B) that are capable of operating server applications such as databases and also capable of communicating over networks 205. One embodiment using server computers may involve the operation of one or more central systems to process models distribute the processed information to nodes on a network.

Client computers 215 (i.e., 215A, 215B, and 215C), which may take the form of any intelligent machine, may also be coupled to networks 205, and/or data server computers 210. In some embodiments, network architecture 210 may also include network printers such as printer 220 and storage systems such as 225, which may be used to store multi-media items or other data that are referenced herein. To facilitate communication between different network devices (e.g., data servers 210, end-user computers 215, network printer 220, and storage system 225), at least one gateway or router 230 may be optionally coupled therebetween. Furthermore, in order to facilitate such communication, each device employing the network may comprise a network adapter circuit and related software. For example, if an Ethernet network is desired for communication, each participating device must have an Ethernet adapter or embedded Ethernet-capable ICs. Further, the devices may carry network adapters for any network in which they might participate (including, but not limited to, PANs, LANs, WANs, and cellular networks).

As noted above, embodiments of the inventions disclosed herein include software. As such, a general description of common computing software architecture is provided as expressed in the layer diagrams of FIG. 3. Like the hardware examples, the software architecture discussed here is not intended to be exclusive in any way but rather illustrative. This is especially true for layer-type diagrams, which software developers tend to express in somewhat differing ways. In this case, the description begins with layers starting with the O/S kernel, so lower level software and firmware has been omitted from the illustration but not from the intended embodiments. The notation employed here is generally intended to imply that software elements shown in a layer use resources from the layers below and provide services to layers above. However, in practice, all components of a particular software element may not behave entirely in that manner.

Figure 3:
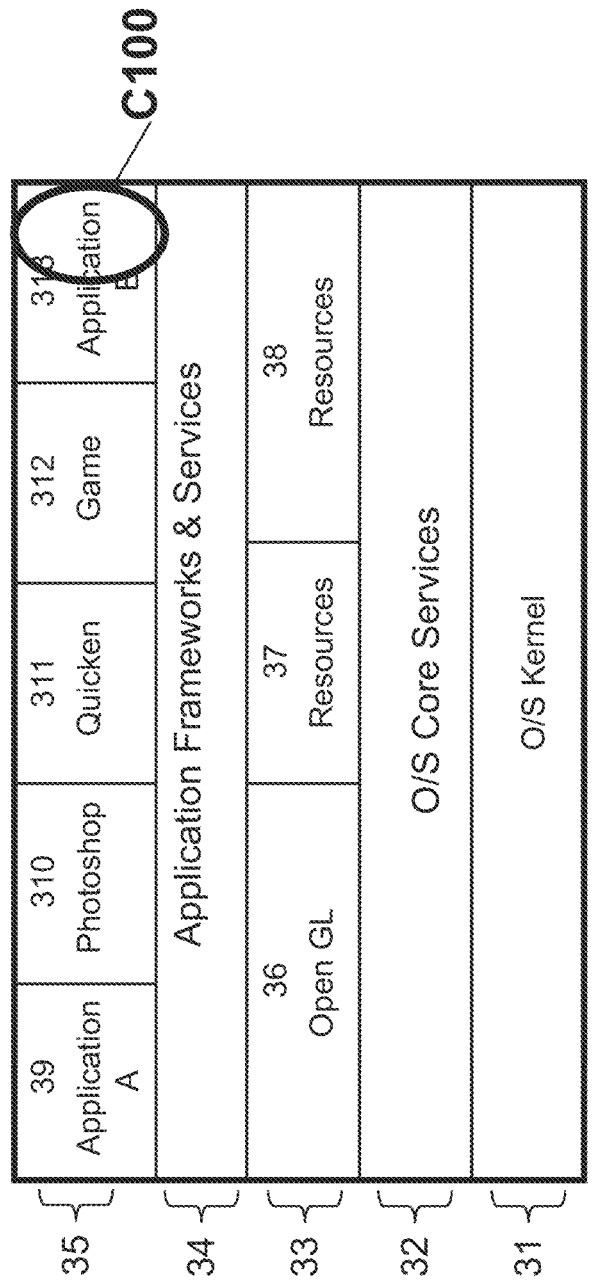
FIG. 3 shows an illustrative software layer and architecture diagram.

With those caveats regarding software, referring to FIG. 3, layer 31 is the O/S kernel, which provides core O/S functions in a protected environment. Above the O/S kernel is layer 32 O/S core services, which extends functional services to the layers above, such as disk and communications access. Layer 33 is inserted to show the general relative positioning of lower level services such as Open GL library and similar application and framework resources. Layer 34 is an amalgamation of functions typically expressed as multiple layers: applications frameworks and application services. For purposes of our discussion, these layers provide high-level and often functional support for application programs which reside in the highest layer shown here as item 35. Item C100 is intended to show the general relative positioning of the application software, including any geoscience related application software or modeling and simulation software described for some of the embodiments of the current invention. In particular, in some embodiments, a geoscience software application is used to interact with the user through user interfaces facilitated by the host device. The geoscience application software allows the user to provide or arrange input parameters or settings and receive output assisting with diversion methodologies, materials, or techniques. The output may be implemented in any or three ways: automatically by the computer's control of tools and equipment; manually, where the user or the user's proxy is provided with instructions for implementing a diversion or one or more aspects thereof; or a combination of the former, where the computer controls some functions and/or tools or equipment and provides instructions or indications for the user that facilitate the process.

In some embodiments, application layer geoscience software may rely on frameworks and resources in one or more of the layers shown as 34 or 33. Furthermore, in some embodiments, the invention or parts and embodiments thereof may be implemented as a resource and/or framework for use with application programs that use an API or interface provided by the invention. For example, any application offering geoscience functionality may use a framework and API to access diversion techniques, methodologies, modeling, simulations, functions, or assistance.

While the ingenuity of any particular software developer might place the functions of the software described at any place in the software stack, the software hereinafter described is generally envisioned as any of: (i) user facing, for example, to allow user operation of geoscience functionality; (ii) as a utility, or set of functions or utilities, beneath the application layer, providing geoscience or diversion resources to application programs or other programs; and (iii) as one or more server applications for providing the same functions and/or services to client devices over a network. Furthermore, on the server side, certain embodiments described herein may be implemented using a combination of server application level software and database software, with either possibly including frameworks and a variety of resource modules.

No limitation is intended by these hardware and software descriptions and the varying embodiments of the inventions herein may include any manner of computing device such as Macs, PCs, PDAs, phones, servers, or even embedded systems.

Diversion

In some embodiments of the disclosure, a successful diversion can be created by understanding the jamming and plugging mechanisms that occur at the entrance of a fluid path. By understanding the physics of the fluid flow and the environment, models may be used to optimize re-work operations so as to use the minimal amount of time and material, yet create a seal that can withstand high pressure differentials even at flow path openings materially larger than the mean particle size of the largest particle. In one embodiment, the average size of the largest particle size may be 3 to 7 times smaller than the opening. There are many complex factors that all affect the efficiency of diversion and they can all either be adjusted or accommodated to achieve minimal flow into highly conductive flow paths.

The current state of the art numerical simulations for fluid path analysis are based on coupled Computational Fluid Dynamics (CFD) and Discrete Element Methods (DEMs). CFD is a branch of fluid mechanics using algorithms as well as numerical analysis to analyze (or solve) fluid flow inquiries or problems. CFD is a computer-based mechanism for making calculations to simulate interactions involving liquids, gases, surfaces, and boundary conditions. A DEM belongs to a well-known family of numerical methods used to compute particle motion and interaction. The models discussed herein may be used to better design and implement processes for controlling fluid diversion and pressure build-up. In many embodiments, coupled CFD and DEM analysis are used to understand and evaluate jamming and plugging mechanisms. For example, coupled CFD and DEMs may be used in some embodiments for probabilistic analysis regarding jamming and plugging in a particular diversion job.

Varying embodiments of the disclosure may use modeling engines, which may incorporate different scenarios so the factors affecting diversion efficiency may be optimized. By designing the application of chemistries, particle shapes, sizes, concentrations and ratios, as well as pressure, temperature, and other parameters, a diversion operation may be engineered and/or customized for the best result for each specific diversion job.

Jamming and Plugging

As discussed above, in some embodiments, significant mechanisms controlling a diversion process are jamming and plugging. Jamming refers to the formation of a stable jammed structure, which may in some embodiments form the base for an effective plugging mechanism. A jamming stage, in one or more embodiments, forms an initial "stable" structure in an opening, which may for example represent the outside or inside of a perforation, door, hole, fissure, natural fracture, hydraulic fracture mouth, etc. The stable structure or jammed state refers to a configuration where relatively large particles provide support for each other, remain stable, and do not pass through the existing opening.

Figures 4A, 4B:
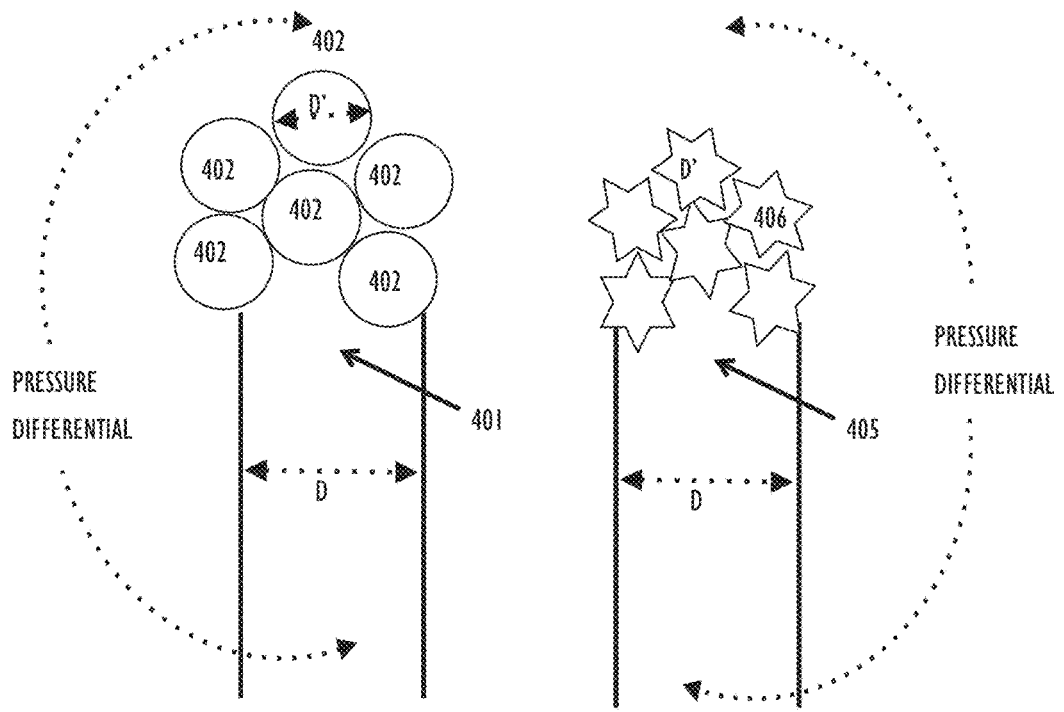
FIGS. 4A and 4B show illustrations of jamming.

Referring to FIG. 4A, there is shown an opening 401 having diameter D, where the opening is jammed with spherical particles 402, having diameter D', where D' is substantially smaller than D. Of course, the shapes of the opening and the particles can vary and neither is necessarily a regular shape. For example, openings in geologic formations may embody any shape whether the openings are naturally occurring or are the result of human activity. Similarly, particles may be designed in any shape, including shapes that embody an aspect of randomness, such as a snowflake. Referring to FIG. 4B, there is shown another opening 405 with diameter D, where the opening 405 is jammed with star or pseudo-snowflake shaped particles having diameter D'. As is evident from FIGS. 4A and 4B, openings 401 and 405 appear stably jammed in that particles having diameter D' can no longer move through or about the opening (although no pressure capability is ascertainable from a drawing). Similarly, particles having sizes even somewhat smaller (e.g., within an order of magnitude or more depending upon the specific configuration) similarly may not pass through the openings 401 and 405. However, fluids and substantially smaller particles (e.g., multiple orders of magnitude smaller depending upon the configuration) may still pass through in small open spaces between D'-sized particles. Therefore stable jamming does not necessarily sufficiently restrict pressure communication for many embodiments of the disclosure or practical applications. For example, in some embodiments, pressure build-up required for successful practical application (such as a re-fracturing operation) may not be achieved by jamming.

Figure 4C:
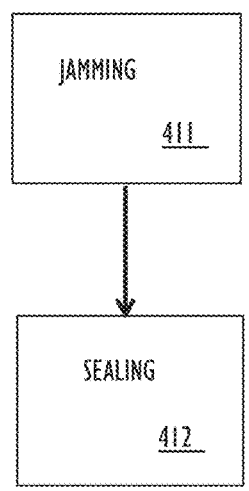
FIG. 4C shows a process or workflow in accordance with one or more embodiments.

With reference to FIG. 4C, an effective diversion over a given aperture or opening may be implemented in a two-phase process as shown. At phase 401, the aperture or opening is jammed and at phase 402, the aperture or opening is plugged. The process of FIG. 4C is not intended to require that the phases are performed either together, overlapping, or in mutually exclusive time periods. Any of these are possibilities contemplated by embodiments of the disclosure.

In order to create a seal over a stably jammed opening or to provide an increased pressure build-up, in some embodiments, a plugging operation may be implemented so that the fluid pathway between the jammed particles (e.g., particles 402 and 406) is either diminished or eliminated at desirable pressure levels. In one embodiment, smaller particles 510 (e.g., smaller than D') may be used to effectively fill the remaining fluid path as shown in FIGS. 5A and 5B. For example, as shown in FIGS. 5A and 5B, smaller particles may form a layer cake between and/or on top of larger particles and may "plug" all or most of the remaining porosity/fluid path. In this manner, pressure communication is reduced across the pressure differential shown in FIGS. 4A and 4B, and pressure build-up occurs. The ability to more accurately build and/or specify pressure build-up allows for more precise and efficient diversion implementation. For example, fracturing fluid may divert away from existing perforations; fissures; natural fractures; or any portion of a formation, such as geologic formations. With reference to FIGS. 5A and 5B, small plugging particles 510 are illustrated by way of example, while the remaining portions of FIGS. 5A and 5B analogize to FIGS. 4A and 4B respectively.

Sample Field Configuration

Figure 6:
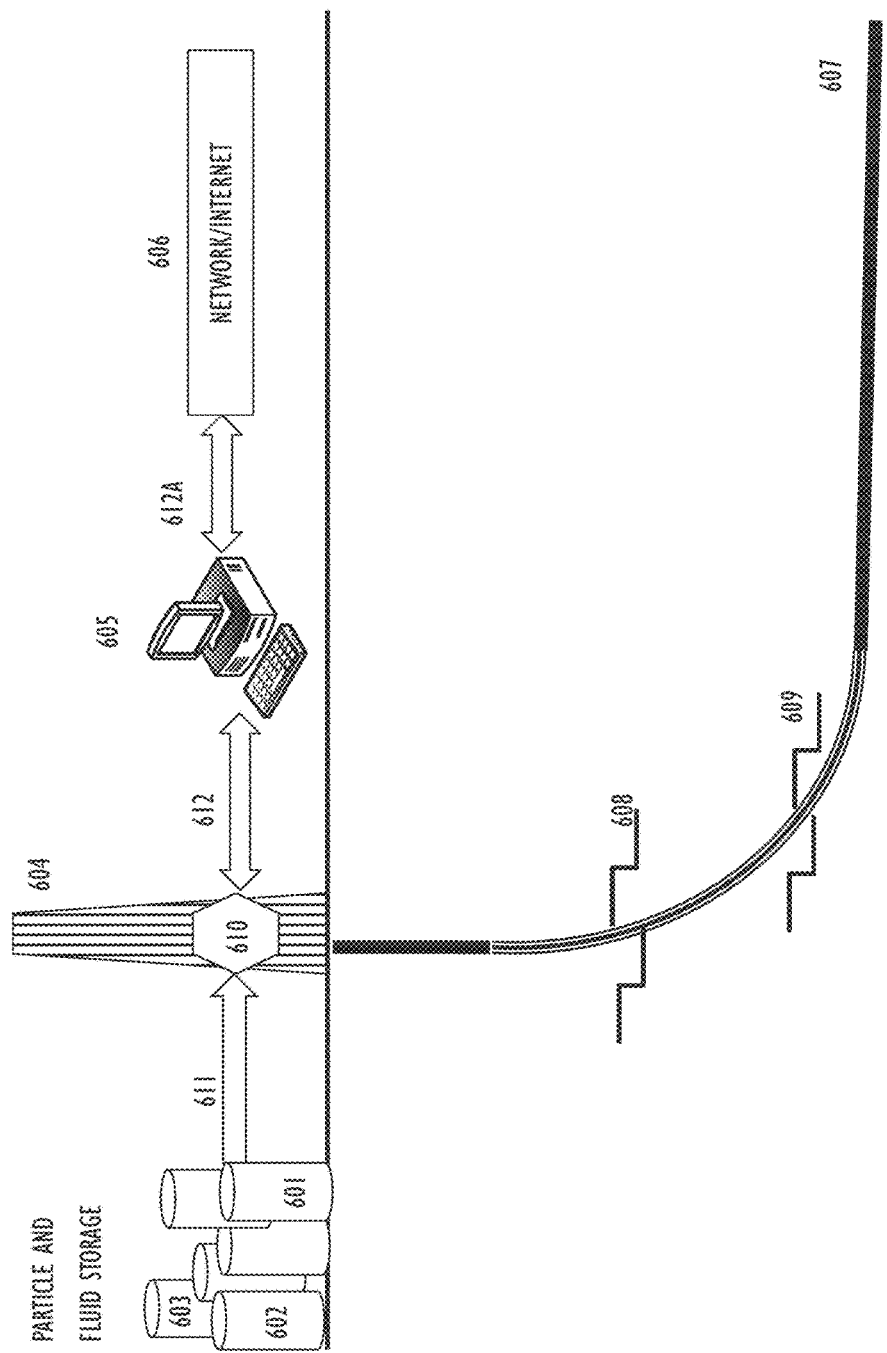
FIG. 6 shows an exemplary well site arrangement.

With reference to FIG. 6, there is shown an embodiment of a field configuration for implementation in the hydrocarbon production industries. Drilling rig 604 is associated with equipment modules 610, which may include common oil field equipment used to manually or automatically prepare material for introduction to the well and to introduce material to the well. Equipment 610 may include pumps, valves, blenders, and any other equipment or machinery known in the art for use at a well site or other location of a diversion job. Equipment 610 may also include items to facilitate removal of fluids and other materials from the well, which may include flow back lines, separators, plug catchers, chokes, tank batteries, production facilities and other equipment or machinery know in the art. Well 607 is shown as a directional well, but the embodiments herein may be applied to vertical, horizontal, or any well or opening in a formation where degradable polymers may be introduced. Well 607 has perpendicular apertures (e.g., fissures) 608 and 609, which are illustrated to represent areas of fluid porosity directed outside of the well bore. At the surface, containers 601, 602, and 603 respectively represent storage for diversion particulates, fluids (such as fracking fluids and mediums for the diversion particulates), and any other materials that may be desirable for use at the well site. The use of only three containers 601-603 is merely illustrative, as many embodiments of the disclosure contemplate as many containers as may be necessary to store any number of different materials, including multiple particulates (e.g., various sizes, shapes, hardness, and degrading characteristics), multiple fluids (e.g., various types of fluids and various viscosities), and many other materials. Conveyance 611 provides a path from the stored material to the equipment module 610 so that materials may be automatically or manually conveyed for entry in the well. Conveyance 611 may include any number of pipes, pumps, valves, or other items to facilitate material movement. Computing device 605 is intended to represent computational capacity at the well site and may be in any known form, including the computing embodiments discussed above. Computing device 605 may include the software architecture described with respect to FIG. 3, which may work in combination with the computer hardware to implement the computing tasks discussed herein, such as analysis, modeling, and sensing. Network 606 represents the ability to communicate offsite and access computing power (e.g., servers) as well as network-based information (e.g., over the Internet or a proprietary network). Network 606 may also take any known form and may also be a permutation of the networks discussed above. Conveyance 612 and 612*a* may be electric or radio communication mediums, such as wires or wireless networking systems, such as PANs or WANs; including cell networks, such as LTE, 3G, Edge, or GPRS; but may take any form known or any form as discussed above for communications. Conveyance 612 and 612*a* may be used to convey control from computer 605 or network resources to control equipment module 610 or any other equipment on site. In addition, or as an alternative, mere instructional information may be conveyed. Furthermore conveyance 612 and 612*a* may be used to communicate information from the well or equipment to computer 605 or a network-based resource, which may include for example well logging information, any sensor information (such as pressures), equipment status, production data, and any other information available from the well or its attendant personnel and/or machinery.

Figure 8:
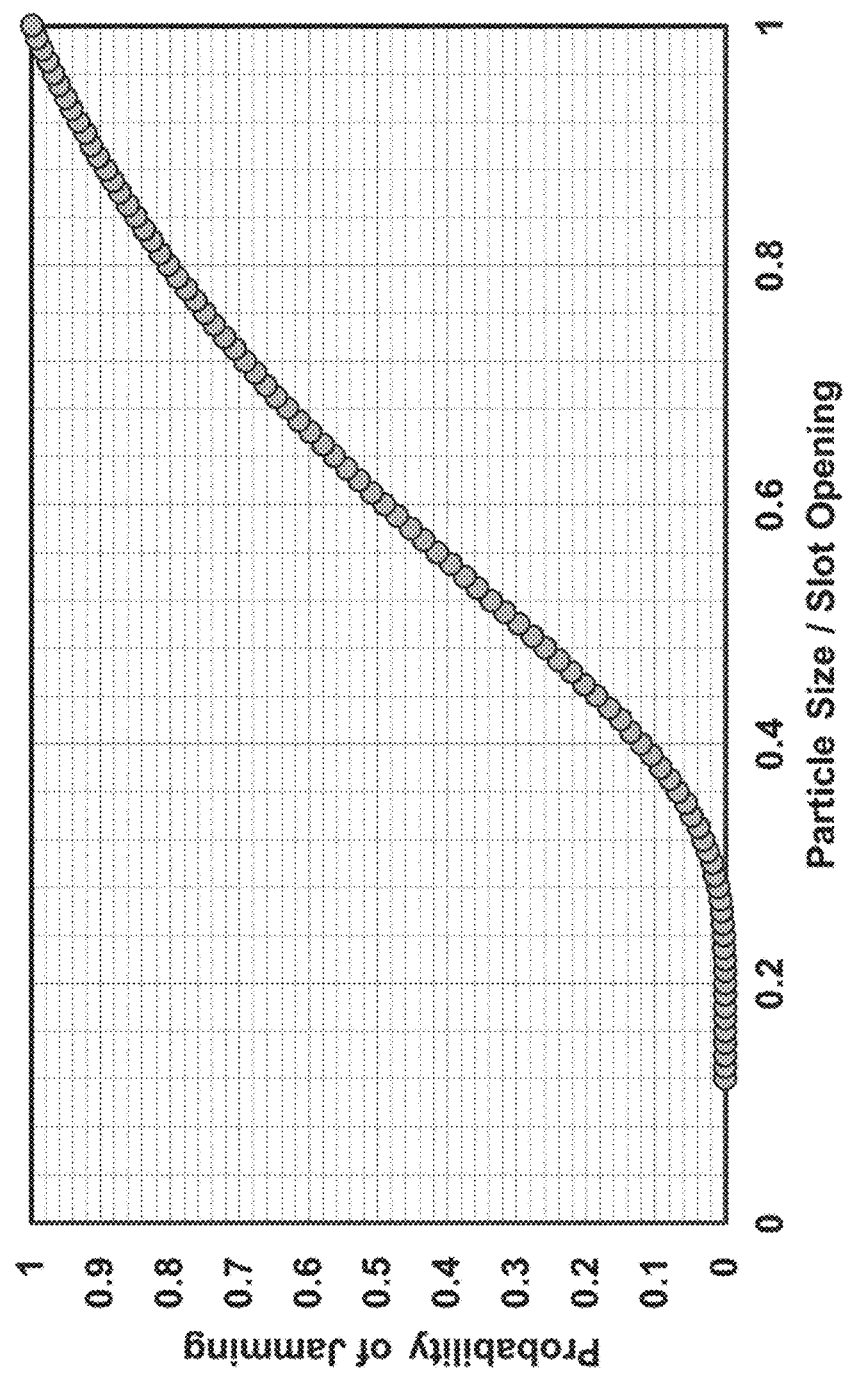
FIG. 8 shows a graph related to particle sizing.

Parameters Considered and/or Controlled for Diversions Involving Jamming and Plugging Many embodiments of the disclosure envision accessing and manipulating all possible parameters related to creating and sustaining one or more diversions in a fluid passage system, such as a well. In one or more embodiments the following parameters are considered and/or manipulated as follows:

Particle size. Particle may be assessed by any known manner, such as diameter or circumference or averages of these and other measures across a population of particles. In some embodiments, particle size is evaluated as a ratio of the opening sought to be jammed or plugged. For example, FIG. 8 shows the probability of jamming as the ratio of particle size to opening size increases, as shown in FIG. 8, as particle size increases relative to opening size, the probability of stable jamming also increases. Thus, some embodiments of the disclosure bias toward larger particles to increase the probability of jamming. In addition, some implementations of an embodiment use only two particle sizes, a large particle size for jamming and a small particle size for plugging. In one particular embodiment, the small size is 100 mesh and the large size is 7 mesh.

Opening size. Opening size represents the size of the opening to be jammed and/or plugged. This may apply to openings in any context where diversion is desirable and is not confined to the hydrocarbon industry. However, in many embodiments of the disclosure, openings may refer to perforations, fissures, natural formations, or any aperture to be plugged. As discussed above, when the ratio of particle size to opening size increases, jamming probability also increases. Thus, for some embodiments of the invention, there is recognition of a decreased probability of stable jamming as opening size rises.

Particle shape. Particles may take any geometric shape or non-geometric shape, such as a snowflake. Many embodiments of the disclosure provide for optimizing the use of different particle shapes based on a combination of numeric, analytic, field, and experimental data. In addition, some embodiments of the disclosure may be based upon empirical data collected from limited testing. Using a spherical shape as a reference, the limited testing may provide an indication regarding jamming and plugging properties of different shapes. For example, in comparing the jamming related behavior of three particles, the inventors have found that spherical particles provided the lowest jamming probability, while quasi-spherical particles performed better, and non-spherical flakes performed best. Furthermore, the limited test indicated that the less spherical the particle, the larger the stable bridge that may be constructed with the particle. Similarly, the less spherical the particle, the lower the probability that no bridging will be possible. Some embodiments of the disclosure contemplate that less spherical shapes may lead to higher pressure build-up. Therefore, in some embodiments, less spherical shapes are correlated with both more stable jamming probability and more effective plugging. Of course, while the results from this limited test and any future testing may bear on any particular embodiment, no testing detracts from the embodiments that rely on shape optimization based upon a combination of numeric, analytic, field, and experimental data. Using these techniques, any type of specific shape may be tested and modeled to determine specifically beneficial shapes for a given formation or diversion job. Finally, in some embodiments, a particle may be measured or judged as large based upon either its aspect ratio or it largest single dimension.

Particle friction coefficient: Particle friction coefficient refers to the friction coefficient between particles. The inventors have demonstrated that higher friction coefficients correlate with higher stable jamming probability and higher plugging probability. Thus, some embodiments herein apply higher friction particles for increasing either or both of stable jamming probability or plugging efficiency and pressure build-up.

Particle density. In relevant part, particle density refers to the density of a particle relative to the carrier fluid. If the particle is denser than the carrier fluid, it tends to deviate from the flow of the fluid and is less likely to reach the opening absorbing fluid flow as desired for jamming. Therefore, in some embodiments of the disclosure, lower particle density (ratio to carrier fluid, e.g. approaching 1) is correlated with higher probability of stable jamming.

Particle concentration. Particle concentration refers to the mass or weight content of particles in a volume of fluid (e.g., pounds per gallon or Kilograms per liter). In many embodiments, particle concentration levels may be optimized by determining the minimum concentration required to plug a specified opening. In other embodiments, particle concentration levels may be optimized by determining the minimum concentration required to plug a specified opening, given one or more other variable constraints such as time. In one or more embodiments of the disclosure, higher particle concentration is correlated with higher stable jamming probability.

Particle ratio. Particle ratio refers to the weight or volume percent ratio between different particles held in the same carrier fluid. Thus, for example, in a two-particle mix, having one large particle (approx. 7 mesh) type and a small particle (approx. 100 mesh) type, particle ratio refers to the weight or volume percent ratio between small and large particles. The inventors have found that a greater presence of small particles reduces probability of stable jamming, but increases the efficiency of plugging and pressure build-up. Therefore in some embodiments, higher ratios of smaller particles are correlated with lower stable jamming probability, and higher probabilities of plugging. In addition, in one or more embodiments, numerically weighted size average is correlated with stable jamming probability and inversely correlated with plugging, so that the numerically weighted size average of all particle types in the carrier fluid is associated with stable jamming probability (i.e., higher average=higher stable jamming probability) and inversely correlated with plugging (i.e., higher average=lower probability of plugging). Furthermore, the inventors have determined that a band of small particle ratios may facilitate using the same mixture for plugging and jamming (e.g., where the small particle is 100 mesh and the large particle is 7 mesh). For example, ratios in the band from X % small particles to (X+Y) % small particles may best facilitate jamming and plugging with the same mixture. In some embodiments, the values of X and Y may be found by experimentation and simulations.

Flow rate. Flow rate refers to the amount or volume of material movement over a specified period of time. For example, a mass flow rate may be expressed as Kilograms per minute, while a volume flow rate may be expressed as liters per minute. Flow rate is a parameter that may be useful in designing diversion systems and particularly with respect to jamming and/or plugging analysis.

Fluid viscosity: Viscosity refers to the thickness of a fluid and in particular the fluid property that resists forces tending to cause the fluid to flow. Viscosity is a parameter that may be useful in designing diversion systems and particularly with respect to jamming and/or plugging analysis.

In addition to the foregoing parameters and embodiments, varying embodiments of the disclosure seek to measure, contemplate and/or manipulate one or more of the following diversion-related parameters:

particle size (either for jamming or plugging);
perforation size of the openings to be plugged;
size of the fluid path on the proximal side of the intended work area;
size of the fluid path on the distal side of the intended work area;
particle shape(s) (e.g., different shapes or the cylindrical aspect of a particle shape);
friction coefficients between like-type particles;
friction coefficients between each pairing of different types of particles available;
friction coefficients between each particle type and each available carrier fluid (or the availability of tables/equations to calculate these coefficients as viscosity changes);
friction coefficients between the each type of particle that may be introduced and the target formation;
particle/fluid density ratio;
ratio of concentration between different particle types simultaneously introduced;
concentration of each particle type;
overall concentration (all particle types together) or injection ratio (e.g., pounds per gallon)
fluid flow rate or pump rate (e.g., volumetric flow rate);
fluid viscosity (i.e., carrier fluid);
ratio of particle sizes;
ratio of different particle shapes (e.g., mass based);
ratio of particle hardness (elastic property measured in mpa);
blending rate;
ratio of different particle types;
perforation geometry (known or measured);
particle properties (for each particle type) including without limitation, chemistry of the particle/polymer, elastic prosperities, tensile strength, compression strength, and friction coefficients as noted above;
fluid properties, including density, viscosity, fluid type (e.g., water based, oil based, emulsions), and PH;
additives and properties of additives (e.g., surfactants and corrosion inhibitors); and
formation data, including type of formation (e.g., shale, etc.), mechanical and reservoir properties, depth, geological factors, geo-mechanics factors, production data (e.g., amount of hydrocarbon being produced), and production size.

Workflows or Processes

Figure 7C:
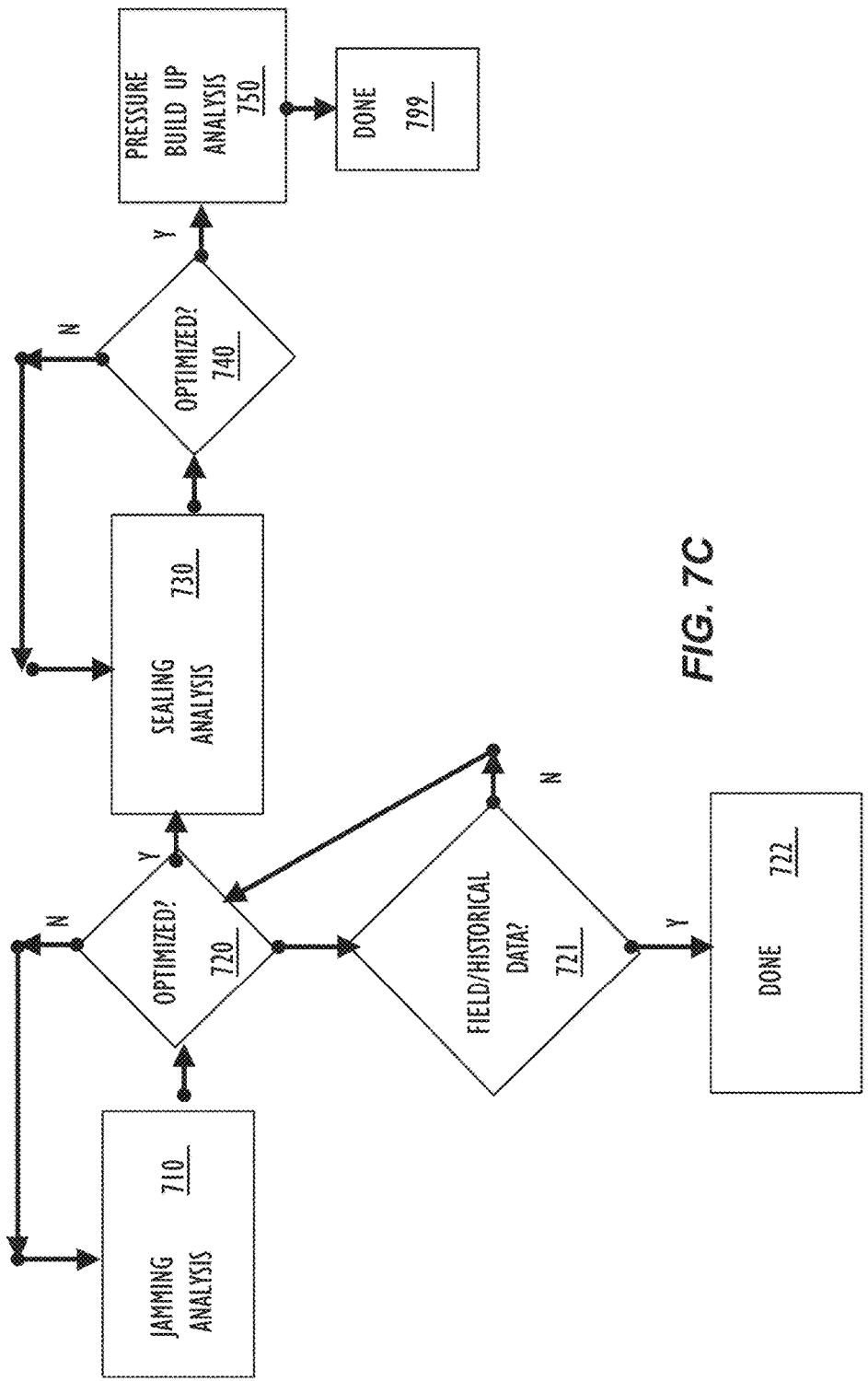

A workflow or process may be designed to optimize diverting agent design and the particulars of particle jamming and plugging. FIGS. 7A, 7B, 7C, 7D, 7E, and 7F show processes or workflows in accordance with one or more embodiments. In some embodiments, a general proposed workflow starts with a candidate screening process to determine wells that are advisable for analysis and work-over (Blocks 705 & 706: FIG. 7F). Once a suitable candidate well is identified, required breakdown pressure (Block 711b: FIG. 7B) and Perf design (Block 711a: FIG. 7B) can be determined in jamming analysis (Block 710) based upon factors for the specific well. A quicklook screening analysis may be performed to check the extent of feasibility of a candidate set of initial particle types (potentially including size, shape, and chemistry) and diverting agent. A quick-look analysis saves engineering and computational resources by assessing particle size with respect to the opening diameter that needs to be jammed. If the quick-look analysis provides feasible candidate particle types, then advanced analysis (e.g., Blocks 720, 730, 740 & 750) may be employed deeper in the workflow. For example, look-up tables based on advanced analysis can be used to optimize design and simulate "plugging." This involves fully coupled flow-polydisperse particle transport models to adjust particle concentration, ratio, shape, and flow rates. Predicted pressure build-up (i.e., capability using a candidate set of parameters) may be evaluated with respect to formation breakdown pressure (Block 750). As then shown in Decision 752 of FIG. 7E, for example, if the predicted pressure build-up is greater than the breakdown pressure (i.e., the breakdown pressure is less than or equal to the predicted pressure build-up due to plugging) (Yes at Decision 752), the design may be finalized (Block 799). If the predicted pressure build-up is less than the breakdown pressure (i.e., the breakdown pressure is greater than the predicted pressure build-up due to plugging) (No at Decision 752), model parameters may be fine-tuned (Blocks 750, 751a-b & 752), and a new candidate set of parameters may be produced with more sensitivity to the pressure constraints. The workflow can be used in real-time or intermittently applied with field implementation so field design parameters can be updated accordingly.

Specific Illustrative Workflow or Processes

Referring to FIG. 7A, there is shown an illustrative process or workflow for creating a diversion in a fluid flow path by jamming and/or plugging an opening such as a perforation. At 710, jamming analysis is performed. In many embodiments, jamming analysis includes optimizing different parameters that contribute to the jammed structure stability and probability of success. In one or more embodiments, the optimized parameters include, without limitation, particle size, ratio, and concentration. In some embodiments, jamming analysis 710 may be used to narrow a selection of particle types (e.g., particle size, shape, and chemistry) to be considered in later modeling/analysis during plugging analysis 730 or even later portions of the process/workflow of FIG. 7A (e.g., limit further consideration to 3 to 5 particles). In other embodiments, jamming analysis 710 results in a set of selected parameters for consideration in subsequent operations such as plugging analysis 730 and portions of FIG. 7A beyond plugging analysis.

In many embodiments of the disclosure, coupled Computational Fluid Dynamics (CFD) and Discrete Element Method or Model (DEM) approaches are used to develop probabilistic curves (or tables such as Look-Up Tables (LUTs)) to aid with "jamming" analysis. In most embodiments, coupled CFD and DEM analysis includes extensive numerical simulations. Given, the large number of particles being modeled, coupled CFD and DEM analysis is infeasible without computers, thus embodiments herein may employ coupled CFD and DEM through software as discussed above using computing technology as discussed above. In addition, custom applications designed to provide all or part of the functionality of FIG. 7A may use service software to provide the coupled CFD and DEM functionality. The service software may be in the application layer or a framework layer as taught herein with respect to FIG. 3.

In one or more embodiments, the curve or LUTs created through coupled CFD and DEM techniques may be employed to investigate the effect of different parameters on the probability of jamming. In some embodiments, the parameters under investigation are one or more of particle size, ratio of particles, existence of small particles (i.e., more than a magnitude smaller than the jamming particle size), perforation geometry of the target formation, and particle shapes. Of course, depending upon available time and computing resources, any number of parameters as identified above may be modeled and evaluated. By using the coupled CFD and DEM modeling, the selected parameters can be optimized to increase the probability of jamming under specific operational conditions. A sample probabilistic analysis derived by coupled CFD and DEM techniques may be seen in FIG. 8, where the probability of jamming (Y axis) is plotted against the ratio of particle size/slot opening (X axis). The curve, which may easily be represented in a LUT for easier computer accessibility, aids with the selection of particle size because it shows how likely different particle sizes are to jam formation openings of proportionally indicated sizes.

In certain embodiments, jamming analysis 710 may also include deterministic/analytical models that are used to examine the stability of a jammed structure. A deterministic approach or model is one without randomness such that the same set of inputs will always produce the same output. With the aid of a deterministic model or approach, or by actual experimentation, particle properties as discussed above may be modified to achieve higher plug stability, which may be required for successful jamming in a particular modeled application. In one embodiment, one or more of the following particle properties is used for this purpose: particle size; ratio of different types of particles; friction coefficients, including particle-to-particle, particle-to-fluid, and particle-to-formation; and particle elastic properties. In one or more embodiments, a deterministic approach may be employed to determine stable plug configurations and/or geometries and to verify or calculate a pressure limit that the jammed structure can sustain. In some embodiments, the stability of a jam may be assessed based upon particle size, particle shape, opening size, and opening shape.

Figure 9:
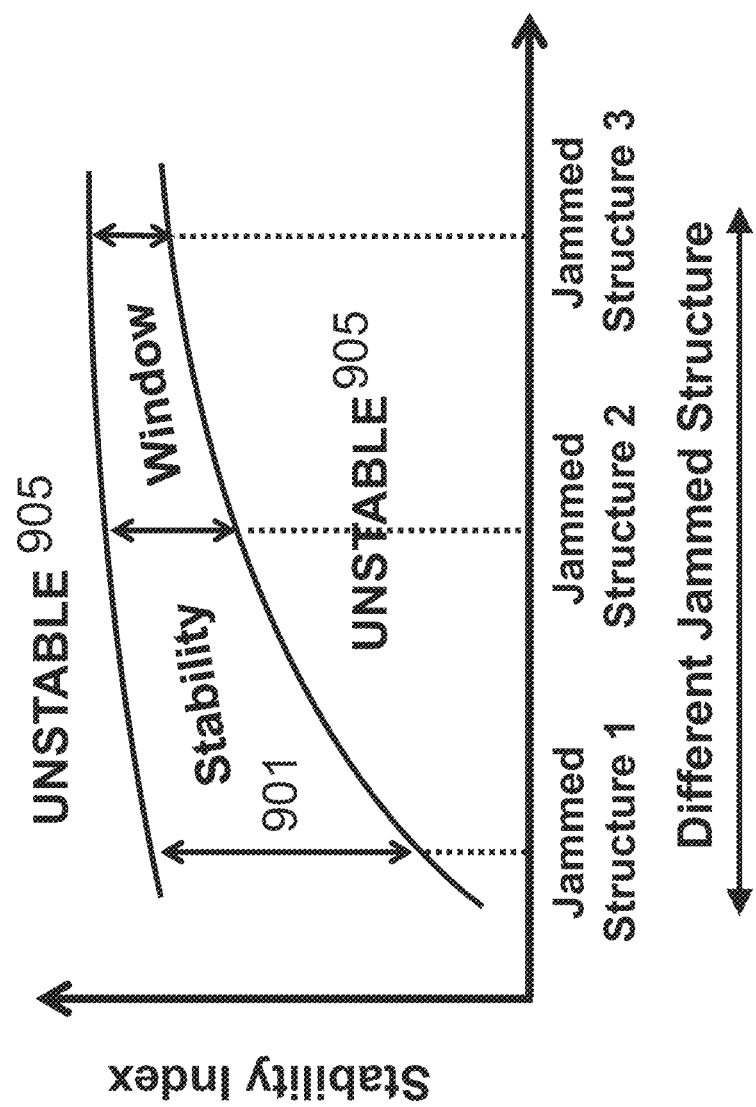
FIG. 9 shows a graph related to particle sizing and pressure build-up.

FIG. 9 shows an example of deterministic evaluation in a jamming analysis. With reference to FIG. 9, there is shown a graph with different jammed structures corresponding to a combination of parameters shown on the X-axis and stability index shown on the Y-axis. The graph of FIG. 9 is separated into regions indicating unstable jamming arrangements 905 and stable jamming arrangements 901. The vertical lines labeled respectively "jammed structure 1" through "jammed structure 3" show that, for a given jammed structure, different ranges of stable jamming may be achieved. For example, under a specific combination of parameters, jammed structure 1 has a high range of stability while jammed structure 3 has a relatively low range. Some embodiments of the disclosure may use an analytical engine to investigate the stability of a jammed structure. Using this modeling, different parameters affecting a given or hypothetical jammed structure stability may be investigated and optimized. For example, modeling may be employed to determine the appropriate values of parameters (e.g., particle size, mechanical properties, etc.) that result in jams in the stable region 901. Thus, a target pressure or breakdown pressure may be achieved for more efficient jamming. The same analysis also may apply for plugging.

Referring now to FIG. 7B, there is shown a version of FIG. 7A where an embodiment's sub-operations for jamming analysis 710 are shown. At 711a, a Perf analysis may be performed. Perf analysis is a topic of Weatherford International's FracAdvisor. In general, Perf (i.e., performance) analysis provides objective and/or subjective information to determine the extent of benefits available (or not) from well stimulation, such as a fracking work-over. At 711b, which may be performed in any order (including simultaneously) with respect to Perf analysis 711a, required breakdown pressure (BDP) is analyzed. BDP analysis is also known in the art, and relates to either: determining the pressure build-up that is desired (and should be endurable by the diversion); or determining whether an optional jamming configuration can withstand the desirable pressure build-up. The BDP may be calculated based upon techniques known in the industry. It may also be derived from one or all of pumping curves, pressure curves, or field observations. At 712, proposed particle sizes, shapes, and properties may be optimized and, in one embodiment candidate, optimized particles may be selected. In some embodiments, these factors are derived by application of the probabilistic and deterministic techniques discussed above. In one or more embodiments, three to five options are yielded for particles, including a particle size; shape; and at least one other particle property, such as chemistry. In another embodiment, only one particle option is yielded, also including one or more of particle size, shape, and at least one other particle property, such as chemistry. Of course, the skilled artisan will recognize that any embodiment may employ any number of particle properties or parameters, such as those discussed above.

Returning now to FIG. 7A, after item 710 (potentially including items 711a, 711b, and 712), control moves to decision block 720, where a determination is made regarding whether jamming analysis has been optimized. In one or more embodiments, optimizing jamming analysis refers to whether the parameters of particle size, shape, and chemistry for jamming have been sufficiently optimized. In other embodiments, optimizing jamming analysis may refer to sufficiently optimizing one or more parameters of any nature (e.g., any of those parameters discussed above). For example, and in some embodiments, in order to be considered optimized, the available jamming analysis result must meet one or more pre-determined criteria. Each criterion may have its own threshold or tipping condition and the criteria may include one or more of the following: provision of a reduced set of potential particles for jamming (i.e., reduced from all possibilities); provision of 5 or fewer potential particles for jamming (or below any pre-determined threshold); provision of a ranked set of particle possibilities for jamming; provision of the ranked set wherein the ranked set is at least 5 in length or beyond a pre-determined threshold in length; or provision of a set of candidate particle types where each particle type is predicted to satisfy a minimum stability requirement, and where the stability requirement may or may not be job-specific.

Referring back to FIG. 7A, if there is a determination that optimize decision 720 has not been met, the control moves back to jamming analysis 710 for another attempt to develop candidate particles for an appropriate jamming structure. In one or more embodiments, upon return to the jamming analysis stage 710 after a negative decision from any decision block in the process of FIG. 7A, the jamming analysis is altered to account or compensate for the factors causing the negative decision. For example, if a negative decision at optimized block 720 was caused by a failure of candidate particle types to meet a minimum stability requirement or prediction, then jamming analysis 710 may heighten the stability sensitivity for the next set of candidate points.

If the optimize 720 decision has been met affirmatively, control moves to plugging analysis 730. Referring now to FIG. 7C, in one or more embodiments, there is a third option for decision block 720. For these embodiments, the optimized block 720 evaluates (at 721) one or both of field data from the job under consideration and historical data regarding other jobs and determines whether the further analysis of FIG. 7A is warranted. For example, in view of the field data and/or the historical data, the likelihood of a successful plugging may be high enough that further expense and time of analysis is not warranted or economically advisable. In this case, one or more candidate particles chosen at the jamming analysis 710 are used the process of FIG. 7A ends with that result. In these embodiments, if the field/historical data review 721 does not indicate an end to analysis 722, then control returns to decision block 720 for the determination regarding whether optimization has been reached. In yet another possible alternative, the jamming analysis 710 may lead to a decision to abandon the process altogether for lack of feasibility or for overly high cost.

Returning again to FIG. 7A, as stated above, if optimize decision 720 is answered in the affirmative, then control moves to plugging analysis 730. In one or more embodiments, plugging analysis 730, evaluates some or all of the candidate particles produced by jamming analysis 710 and attempts to optimize any one or more of the parameters relating to the wet state of the system, e.g., particle concentration, ratio of particles (with respect to different types being used), and flow rate. In order to make this evaluation, plugging analysis 730 may use one or both of DEM analysis (discussed above) and computational fluid dynamics (CFD). Both techniques are know in the art and discussed elsewhere in this specification. Plugging analysis 730, in some embodiments, may be predicated by information known from jamming analysis 710. For example, by using a candidate particle resulting from jamming analysis 710, the nature of the formation requiring plugging may be narrowed, which simplifies and focuses the plugging analysis 730.

With or without DEM and CFD, many embodiments of plugging analysis 730 focus on a wet and full physics-based analysis of particle movement in the modeled system, which may include one or more modeled scenarios. This physics-intensive analysis may investigate drag forces, fluid properties, particle-to-particle interactions, particle-to-perforation interactions, and particle-to-wall interactions, all for different types (sizes, shapes, etc.) and different combinations of particles at different concentrations.

In one or more practically constrained embodiments, the selection of small particles (i.e., plugging particles as compared to jamming particles) is limited to one or a few particle types. Thus, the analysis and modeling in those constrained embodiments may be limited to evaluating each candidate jamming particle with a single plugging particle, resulting in an analysis focused on optimization of concentration, rate, and particle ratio. The variation of rate, ratio, and concentration may be employed to facilitate or optimize plugging in any embodiment.

Figure 7D:
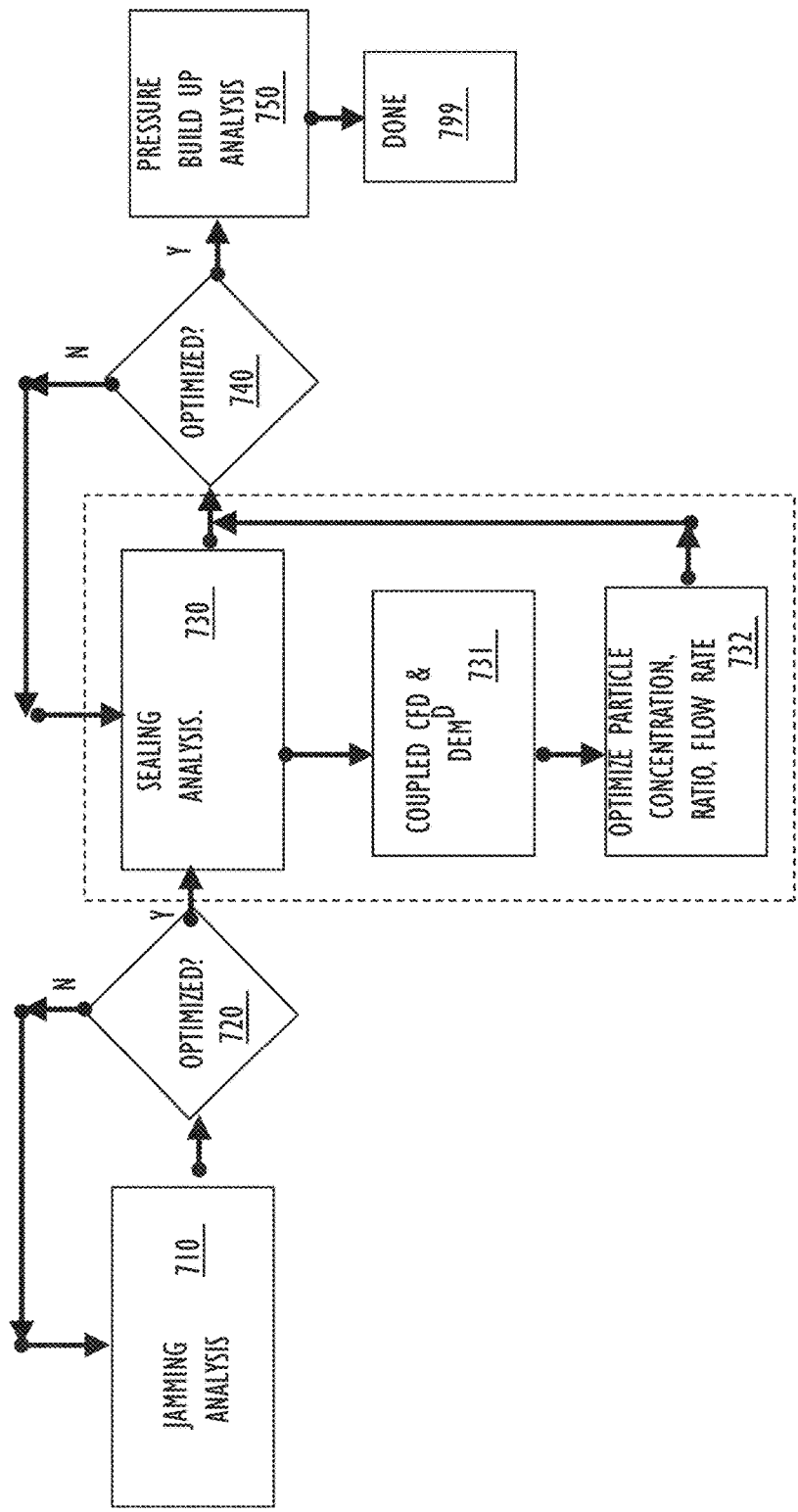

Referring now to FIG. 7D, there is shown an expanded view of plugging analysis 730, including sub-steps 731 and 732. In the embodiments of FIG. 7D, plugging analysis 730 may include coupling of CFD and DEM analysis 731. CFD and DEM analyses are described above. In some embodiments, the CFD and DEM analyses are employed to simulate varying particle combinations in the presence of the specific job conditions.

At block 732, it is shown that plugging analysis 730 may also include optimizing particle concentration, ratio, and flow rate. In one or more embodiments, once a successful jammed structure is in place, it may be effectively plugged for efficient pressure build-up and fluid diversion. Based on data specific to a job, engineering design parameters may be selected and optimized to reach the desired pressure build-up required to create new fractures. In many embodiments, the design parameters include, without limitation, particle concentration, ratio of particle types (e.g., size or shape distribution), and flow rate. Other parameters may be mechanical properties and fluid properties. The selection of these parameters may be made by running coupled CFD-DEM simulations for real case scenarios or by using operational guidelines generated based on different approaches. These simulations can capture both particle-particle interaction and transport and also fluid diversion and pressure build-up required to design a successful diversion process. Using the best results from the simulations may optimize the parameters such as particle concentration, ratio, and flow rate. Furthermore, in some embodiments, a ranking of results may be maintained and stored in memory for later reference if, for example, there is a negative result in an optimized decision block later in the process.

Referring again to FIG. 7A, after plugging analysis, there may be a second optimized decision block 740, where a decision is made regarding whether plugging analysis has been optimized. In some embodiments, optimizing plugging analysis refers to whether the parameters of particle concentration, ratio, and flow rate have been sufficiently optimized. In other embodiments, fewer or greater numbers of parameters may be considered. In order to be affirmative for the optimized block 740, the available plugging analysis result must meet one or more pre-determined criteria. Each criterion may have its own threshold or tipping condition and the criteria may include one or more of the following: provision of a parameter set predicted to provide effective plugging and diversion at a specified pressure level; provision of a ranked set of parameters for plugging where at least the highest ranked parameters are predicted to provide effective plugging and diversion at a specified pressure level; or provision of one or more particle types (which may include size, shape, and or chemistry), a ratio of particle types, a flow rate, and a concentration level, where the combination is predicted to provide effective plugging and diversion at a specified pressure level.

Referring back to FIG. 7A, if there is a determination that optimize decision 740 has not been met, the control moves back to plugging analysis 730, for another attempt to develop at least one candidate rate, ratio, and concentration parameter set. In one or more embodiments, upon return to the plugging analysis stage 730 after a negative decision from decision block 740, the plugging analysis 730 is altered to account or compensate for the factors causing the negative decision at 740. For example, if a negative decision at optimized block 740 was caused by a failure of a candidate parameter set to meet a pressure limitation, then jamming analysis 730 may heighten the pressure sensitivity for the next set of candidate parameters.

Figure 7E:
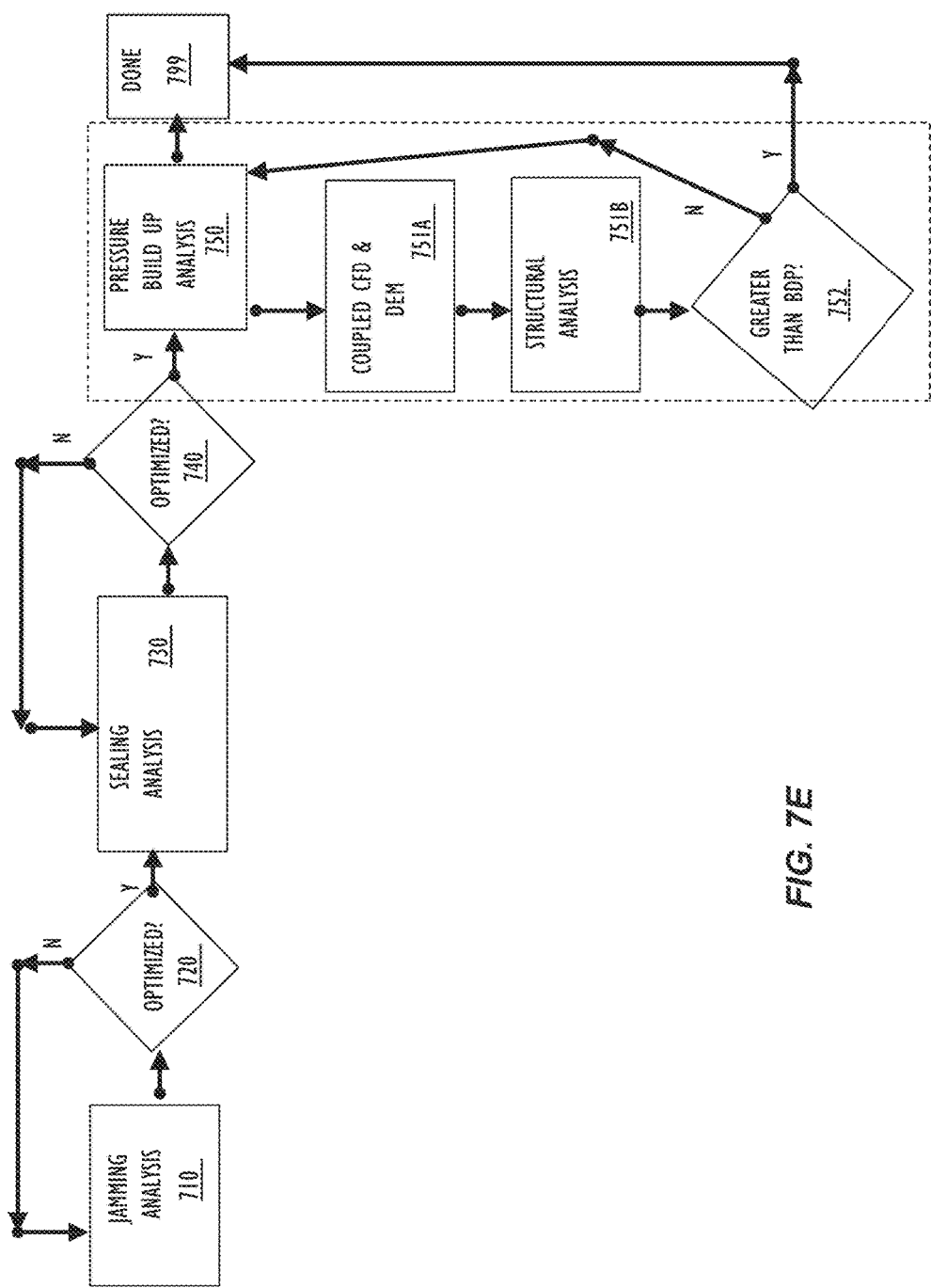
Figure 7F:
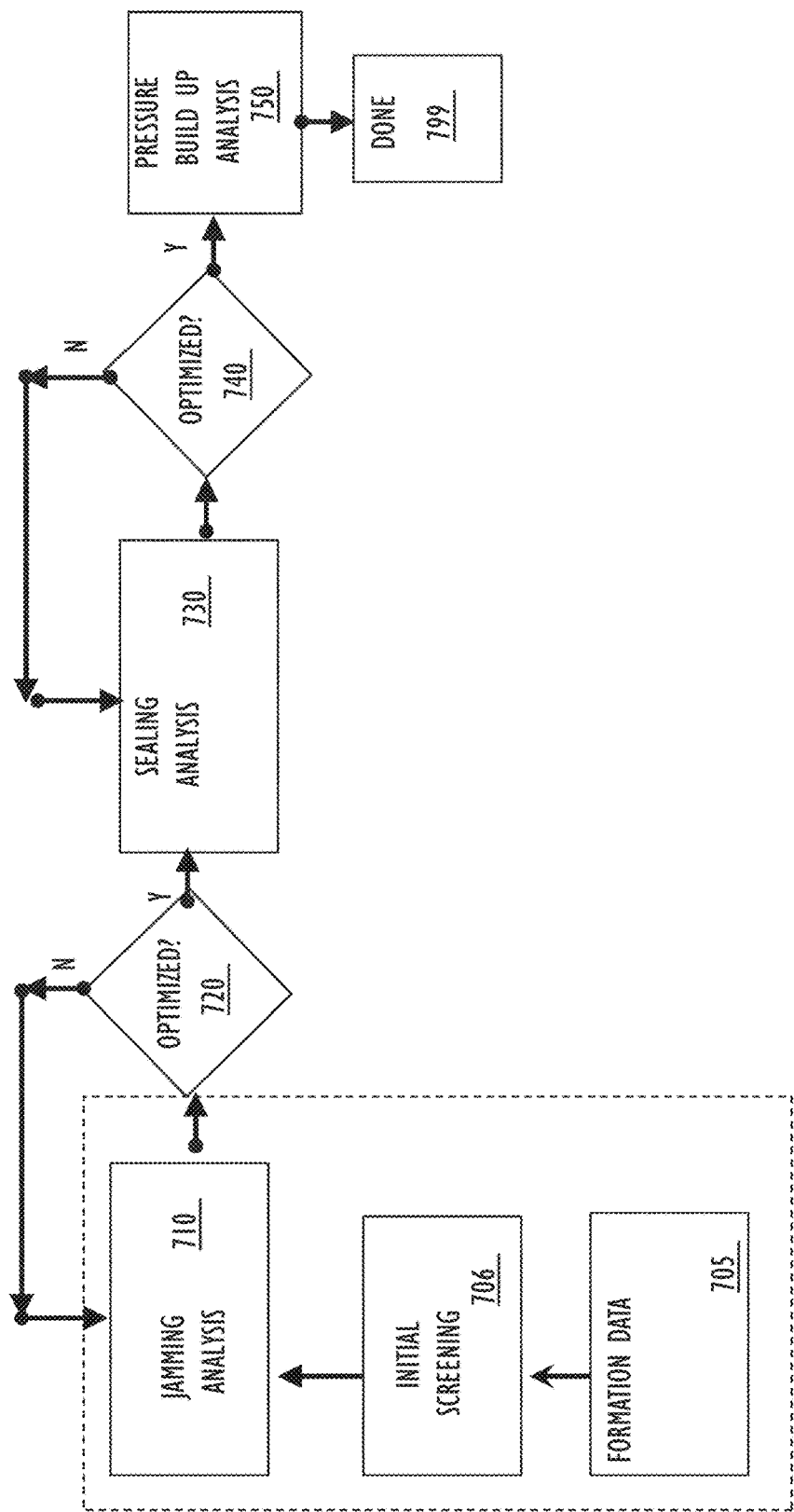

If the optimize 740 decision has been met affirmatively, control moves to pressure build-up analysis 750, where one or more candidate parameter sets are evaluated for compliance with the breakdown pressure for the specific job. The evaluation may take any form discussed herein or otherwise known in the art. With reference to FIG. 7E, there is shown an embodiment specifying particular activities 751a, 751b, and 752 as sub-parts of pressure build-up analysis 750. In particular, at 751a, coupled DEM and CFD analysis is shown, as discussed above. Further, at structural analysis block 751b, a complete structural analysis of the jammed and plugged structure is evaluated through modeling. Finally, at decision block 752, there is a final check to determine if the selected parameter set for field use meets the BDP (i.e., Is the pressure build-up greater than the breakdown pressure (BDP)?). If the answer is affirmative (i.e., the pressure build-up is greater than the breakdown pressure (BDP)—Yes at Decision 752), then control moves to the completion of the process (Block 799). If the answer is in the negative (i.e., the pressure build-up is not greater than the breakdown pressure (BDP)—No at Decision 752), control moves back to the pressure build-up analysis block 750, where analysis may be repeated with a higher sensitivity regarding pressure. As with the negative decisions above, in some embodiments, the pressure build-up analysis may be altered in a specific response to the negative result at decision block 752.

Particle Degrading Analysis

As discussed above, many embodiments of the disclosure contemplate the use of degrading particles so the jammed and plugged formations will eventually clear themselves and allow fluid flow again. This property is particularly useful in situations where an operator seeks to produce hydrocarbons from a previously sealed area. In one particular example, sometime during a drilling operation the operators may experience an undesirable loss of drilling fluid. The fluid may be lost into unplanned or unexpected openings such as weak, fractured, or vugular formation. Degradable particles may be used as described herein to plug the unplanned or unexpected openings so drilling operations may proceed normally. In some situations, the plugged well may be used to produce hydrocarbons within a short time period from the formation of the plug using the degradable particles. In these situations, as the plug degrades, the degraded particulate matter may flow to the surface with the production fluids. Thus, some embodiments of the disclosure account for any problems or irregularities that might be caused by the flow of degraded particulate in the production fluid. One example of a problem or irregularity is the presence of a sand screen that might be clogged by the degraded particulates.

In some embodiments of this disclosure, the timing of the degrading process is more critical because sand screens may be installed upstream from the plug. The escape of degradable particles that are large enough to clog the sand screen can impede hydrocarbon production. Therefore, in wells that may yield hydrocarbon (or other fluid) production within a short period of time from a plugging effort, some embodiments of the invention model the degrading properties of the particles and/or the expected problem or irregularity that may be caused by the degraded particles. For example, in wells that may use sand screens or in any other situation where the degradable particle breakdown may impede production, it may be useful to model the degrading of the plug so the size and shape of remaining particles at a given point in time may be predicted to prevent production problems, such as clogging the sand screen. In one or more embodiments, modeling may factor one or more of the following: the degrading properties of the available particles (e.g., the time and conditions for the plug degrading given the chemistries of the candidate particles); the specifications of the sand screen or other up-well implements that may be hindered by the up-well flow of the degrading particles; and the expected time between the formation of a plug and the initiation of production or up-well flow from the well. In addition, by considering the foregoing factors, some of the embodiments of this disclosure may predict or specify any of the parameters, such as particle parameters discussed above. For example, some embodiments may predict particle size, particle shape, particle type distribution, and particle chemistry (for each particle type).

In some embodiments, the specifications of a sand screen may be part of the analysis so the optimization of jamming and/or plugging parameters may contemplate the degrading properties of particles such that the sand screens do not become clogged during production. In some embodiments, one specification regarding the sand screen that may be employed is in regards to the size of particles that may flow past the sand screen without clogging or otherwise impeding the performance of the screen. For example, the modeling may contemplate the maximum particle size or average particle size that may flow upstream without causing a production issue such as clogging a sand screen.

Figure 10:
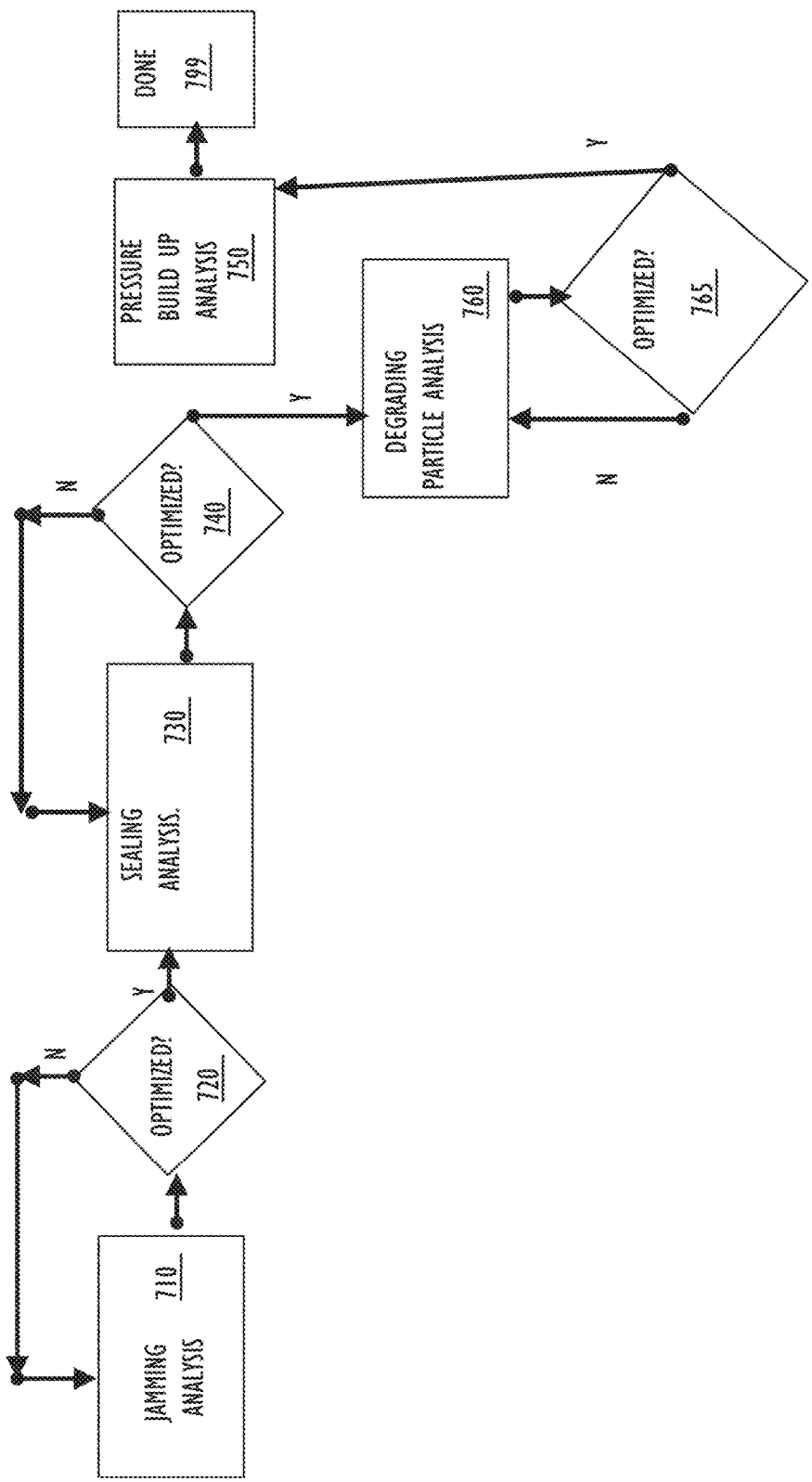
FIG. 10 shows processes or workflows in accordance with one or more embodiments.

With reference to FIG. 10, there is shown an alteration of the process of FIG. 7A where a degrading particle analysis 760 is added with an optimize decision block 765 to determine if the degrading particle analysis is optimized. Since particles often degrade as a function of time, temperature, and fluid exposure, the degrading particle analysis may employ CFD and DEM analysis in many embodiments. Furthermore, in some embodiments, the modeling may predict the ratio of different size particles to be used because smaller particles may degrade more quickly. In other embodiments, the modeling may predict two or more of the following: the sizes of particles to be used; the ratio of different size particles; the chemistry for each particle; and the shape of each particle. In one or more embodiments, given a set of one or more specified particle types, the modeling may predict a minimum amount of time for degrading that must pass in order to safely employ a sand screen without clogging. In some embodiments, particle-degrading analysis 760 occurs after jamming analysis 710 and before plugging analysis 730, while in some other embodiments it occurs sequentially as shown in FIG. 10. In yet other embodiments, particle degrading analysis 760 may be performed as part of jamming analysis 710, plugging analysis 730, or both.

Predicate Screening

With reference to FIG. 7A, some embodiments of the disclosure call for predicate screening prior to the beginning of jamming analysis 710. In particular, as shown in FIG. 7F, some embodiments of the disclosure contemplate the collection of formation data 705 prior to the onset of the process/workflow shown in FIG. 7A. Formation data may include any available data regarding the geologic context of the job under consideration, including generally the following information: field data; log data; core data; acoustic data; outcrop data; and offset well data. In particular embodiments, the following specific data may also be gathered: amount of hydrocarbon being produced; reserve size and production size; viability of the well for hydrocarbons; fracture breakdown pressure; and performance of nearby wells.

In addition, some embodiments provide an initial screening 706, to determine if the inquiry involved in the workflow/process of FIG. 7A is advisable. For example, if a well is performing sufficiently, there may be little or no incentive to investigate a work-over. In addition, if a well has little or no potential to justify the effort of a work-over, then there may be insufficient reason to perform the analysis of FIG. 7A. This type of screening analysis may be performed by, for example, Weatherford International's FracAdvisor product. In sum, according to some embodiments of the disclosure, the best candidate wells for analysis of FIG. 7A are those that are under-performing in production, but have potential to produce materially more hydrocarbons after a work-over. As a threshold basis for this determination, the increased performance in a well may be measured against the cost of the work-over and analysis and the lost production time during the job (e.g., a work-over or fracturing job).

Compensation for Dry Models

In some embodiments, the jamming analysis 710 is a "quick look" analysis, which ignores fluid and particle transport coupling. While this saves time and money, it ignores flow effects relying only on "dry models" where only particle-particle interactions under gravity are simulated. In these embodiments, this may be an intentional oversimplification of reality where polydisperse particles are transported in the system and under the influence of drag forces coupled with particle-particle interactions. For an accurate optimization of flow rate(s), concentration, and other motion-dependent parameters, more intensive analysis may be used relying on Discrete Element Modeling (DEM) coupled with Computational Fluid Dynamics (CFD) as discussed herein. The coupling of these techniques may be used to more realistically simulate plugging/sealing mechanisms. For example, as illustrated above, the coupling of these models can be used for optimizing particle ratio (percentage of small particles or of one particle type to others), particle concentration in the carrying fluid, flow rate, carrying fluid properties, and other motion related parameters. In addition, these models may be used to predict the pressure capabilities of a candidate set of parameters so their capabilities may be compared with formation breakdown pressure. Thus, as discussed above with respect to FIG. 7A (and particularly applicable to pressure build-up analysis 750 discussed above respect to FIG. 7E), diverting agent design can be customized to reach a formation-specific breakdown pressure (Decision 752: FIG. 7E).

Safety Factor

The discussion herein has involved threshold-type limitations regarding jamming stability and pressure tolerance or capability with reference to safety factors. Some embodiments of the disclosure contemplate the use of safety factors, which generally involve applying a multiple to any pressure or stability requirement. For example, a 20% safety factor increases any requirement threshold for pressure of stability by 20% from its base number. In some embodiments of the disclosure, a Monte Carlo analysis is applied to determine an appropriate safety factor for any particular parameter, such as stability or breakdown pressure. The use of Monte Carlo analysis relative to safety factors is well known in the art.

Learning Models

As referenced above, many embodiments of the disclosure contemplate that the models and algorithms may learn from field applications. Thus, some embodiments of the disclosure call for a learning module of the modeling software so that fed-back production data can be contemplated in subsequent use of the model. Furthermore, in some embodiments, the learning module may automatically receive production data, match the data to the former predictions, and vary the model. With reference to FIG. 6, conveyance 612 and network/Internet 606 may be employed to transport data to and from local computers and server-based resources to both perform modeling and implement model learning.

Iterative Mechanisms

As referenced above, many embodiments of the disclosure contemplate the ranking of predicted alternatives as output of the various embodiments of FIG. 7A. The rankings may be used in iterative fashion without the necessity of re-running the mode. Thus, if the first-ranked recommendation does not work (either in real production or in modeling downstream in the process), the next-lowest-ranked alternative may be used and so on.

Model or Algorithm Validation

In some embodiments, the analytical and numerical modeling discussed herein may be improved by validating and tuning against experimental and field data. This verification step may be used to calibrate the model parameters to enhance the prediction accuracy. Successful calibration may be measured by an accurate prediction of failures and design optimization as compared to the field data or experimental data. Results may be applied to guidelines for application in the field.

Modeling with Mixed Field Testing or Use

Many embodiments of the disclosure contemplate the use of FIG. 7A and FIG. 10 models to perform analyses that ultimately direct the use of real world mechanisms, such as particles, fluids, pumps, blenders, valves, and servicepersons. Other embodiments contemplate the intermittent use of real world implements within the modeling stream to affect the progression for the analysis. For example, with reference to FIG. 6, at the conclusion of jamming analysis 710, results from the jamming analysis may be applied to a well and the data from the jamming procedure may be fed back to the process to transform the operation of the FIG. 7 or FIG. 10 processes moving forward. Similarly, the outputs of plugging analysis 730, pressure build-up analysis 750, or particle degrading analysis 760 may be applied in the field with results fed back in a way to affect subsequent modeling.

In addition, some applications of the current disclosure may be initiated in real world, well-site activity and then aided by the techniques discussed herein. For example, if a problem is encountered at a well site and drilling fluid is draining off through an unwanted opening, the techniques herein may be employed to fix the problem. In one embodiment of the disclosure, a problem, such as unwanted drainage, is detected at a well site. Sensors and production data are received related to the problem. The sensor and production data are used to design a diversion operation using the techniques discussed with respect to FIGS. 7A and 10. In some embodiments, a single fluid is developed for jamming and plugging the draining area. In other embodiments multiple fluids are developed, with at least one fluid being directed toward jamming and a second fluid directed toward plugging.

Automatic Model

With reference to FIG. 6, many embodiments of the disclosure contemplate implementations with no or limited automatic connections between the processes of FIGS. 7A and 10 and the operation of the well site. However, other embodiments of the disclosure may require differing levels of interaction and at least one embodiment is fully automated. For example, any computer-controllable implement at the well site may be automatically controlled by the processes of FIGS. 7A and 10. For example, a computerized process may do any one or more of the following: read field data or historical data from servers or its own memory; perform testing on a well site (e.g., provide a stimulus and read sensor data) to receive test data for application to models; read or poll sensors deployed at the well site; create diversion fluids using stored fluid, particles, and water at the well site using a blender, pumps, and conveyances or other implements known in the art; and provide instructions for field technicians to cooperate with or aid the automated processes.

Single-Fluid or Multi-Fluid Applications

Many embodiments of the disclosure result in implementation of a diversion process using a single carrier fluid and particulate that is developed using the teachings hereunder. For example, a single carrier fluid and specified particles at specified parameters may be used for jamming and plugging. Many embodiments herein are particularly well suited for a single-fluid application because the analysis provided herein can optimize the fluid balancing the considerations for jamming and plugging. However, other embodiments of the disclosure use at least two fluids for implementing a diversion. One fluid is applied and optimized for jamming, and the second fluid is applied and optimized for plugging (and even, in some embodiments, where the plugging is optimized to the prior jamming process). Finally, the analysis techniques taught herein provide flexibility to specify and predict results for the applications of 3 or more fluids in a diversion operation. This may be useful in particularly complex well situations where natural, man-made, or production factors favor a layering of particle types, rather than a more heterogeneous application of mixtures.

Design of Particle Properties

As indicated above, in some embodiments, particle properties may be customized to the particular job through the use of analytical and advanced numerical approaches. For example, models and/or algorithms may be constructed to account for input conditions such as target pressure build-up, formation information, and the range of available particle types and chemistries. Given these inputs, the models or algorithms may produce optimized custom values (per job or formation) regarding the application of a particular diversion job, e.g., particle size, particle concentration, and/or particle combination. Ultimately, some embodiments may specify these parameters and predict achievable pressure build-up for the job under analysis. In one or more particular embodiments, custom particle properties (e.g., size, shape, concentration, and ratio) and operational parameters (e.g., flow rate, fluid viscosity, etc.) may be calculated for optimum and efficient jamming and/or plugging operations. Furthermore, the model/algorithm results obtained may be verified (e.g., sanity checked), or recursively improved using field data (e.g., collected from past jobs) and experimental data (e.g., in a lab or test environment) to calibrate the model's/algorithm's parameters.

It is to be understood that the above description is intended to be illustrative, and not restrictive. The material has been presented to enable any person skilled in the art to make and use the invention as claimed and is provided in the context of particular embodiments, variations of which will be readily apparent to those skilled in the art (e.g., many of the disclosed embodiments may be used in combination with each other). In addition, it will be understood that some of the operations identified herein may be performed in different orders. The scope of the invention, therefore, should be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A method implemented by a treatment system for treating a formation having a hydrocarbon well therein, the method comprising identifying, in a computing device of the treatment system, a primary fluid path in the hydrocarbon well having one or more openings to the formation;

determining, in a dry analysis without fluid transport in the computing device, a plurality of jamming characteristics of a diversion agent configured to form a stable jammed structure jamming at least a first of the one or more openings, and developing a plurality of candidate jamming parameters for the diversion agent from the determination;

determining, in a wet analysis with fluid transport after the dry analysis in the computing device, one or more plugging characteristics of the diversion agent configured to at least limit flow through the stable jammed structure of the first opening based upon the received candidate jamming parameters, and developing candidate plugging parameters for the diversion agent from the determination;

determining, in a build-up pressure analysis, that the developed parameters of the diversion agent plugging and jamming the first opening predict a build-up pressure at least meeting a breakdown pressure of the formation adjacent the first opening; and treating the formation with pumping equipment of the treatment system by (i) pumping treatment fluid in the primary fluid path, the treatment fluid comprising the diversion agent based on the candidate jamming and plugging parameters, (ii) jamming and plugging at least the first opening with the pumped diversion agent to divert the treatment fluid, and (iii) breaking down a portion of the formation adjacent the first opening with the diverted treatment fluid.

2. The method of claim 1,
wherein the first phase of analysis optimizes the plurality of jamming parameters to develop the plurality of candidate jamming parameters;
wherein after the first phase of analysis, the method comprises determining if the candidate jamming parameters are optimized; if the candidate jamming parameters are not optimized, returning to the first phase of analysis; if the jamming parameters are optimized, performing the second phase of analysis,
wherein the second phase of analysis receives as input the plurality of candidate jamming parameters from the first phase of analysis and optimizes the one or more plugging parameters related to the first opening and based upon the received candidate jamming parameters to develop the candidate plugging parameters; and
wherein after the second phase of analysis, the method comprises determining if the candidate plugging parameters are optimized; if the candidate plugging parameters are not optimized, returning to the second phase of analysis; if the candidate plugging parameters are optimized, providing the treatment fluid in the primary fluid path.

3. The method of claim 1, further comprising:
performing a third phase of analysis in the computing device by predicting one or more of particle size, particle shape, particle type distribution, and particle chemistry based upon one or more of degrading properties associated with each particle available for use, specifications of one or more sand screens, and an expected time between formation of a diversion and an expected initiation of production from the hydrocarbon well.

4. The method of claim 3, wherein the third phase of analysis occurs either prior to the first phase of analysis or as part of the first or second phase of analysis.

5. The method of claim 1, wherein the one or more openings comprise one of a fissure, a natural fracture, and a perforation.

6. The method of claim 1, wherein the plurality of jamming parameters comprise at least one of particle size, particle shape, particle size distribution, particle mechanical properties, particle frictional properties, particle concentration, injection flow rate, and particle chemistry.

7. The method of claim 1, wherein the plurality of jamming parameters comprise fluid rheological properties.

8. The method of claim 1, wherein developing the plurality of candidate jamming parameters comprises optimizing the plurality of jamming parameters by determining that the candidate jamming parameters meet a minimum stability requirement and a minimum probability of jamming.

9. The method of claim 1, wherein developing the plurality of candidate jamming parameters comprises optimizing the plurality of jamming parameters by using one or more of analytical models, coupled CFD and DEM simulations, and experimental and field data analysis.

10. The method of claim 1, wherein the one or more plugging parameters comprise at least one of particle size, particle shape, particle size distribution, particle mechanical properties, particle frictional properties, particle concentration, injection flow rate, fluid rheological properties, and particle chemistry.

11. The method of claim 1, wherein developing the candidate plugging parameters comprises optimizing the candidate plugging parameters by predicting the candidate plugging parameters to support a pre-determined build-up pressure.

12. The method of claim 1, wherein the second phase of analysis comprises using one or more of analytical models, coupled CFD and DEM simulations, and experimental and field data analysis.

13. The method of claim 1, wherein pumping the treatment fluid comprises pumping a single carrier fluid having particulate of the diversion agent.

14. The method of claim 1, wherein pumping the treatment fluid comprises pumping more than one carrier fluid having particulate of the diversion agent.

15. The method of claim 1, wherein treating the formation comprises fracturing a portion of the formation adjacent the first opening jammed and plugged with the diversion agent.

16. The method of claim 1, wherein the determination in the build-up pressure analysis uses a fully coupled flow-polydiverse particle transport model.

17. The method of claim 1,
wherein determining, in the dry analysis without the fluid transport in the computing device, the jamming characteristics of the diversion agent configured to form the stable jammed structure jamming at least the first of the one or more openings, and developing the candidate jamming parameters for the diversion agent from the determination comprises:
performing, in a first phase of analysis in the computing device, the dry analysis using as input at least data characterizing the one or more openings and data characterizing one or more of a plurality of degradable particle types;
identifying, in the computing device during the first phase of analysis, the candidate jamming parameters, wherein the candidate jamming parameters are optimized with respect to the data characterizing the one or more openings and the data characterizing the one or more of the plurality of degradable particle types;
wherein determining, in the wet analysis with the fluid transport after the dry analysis in the computing device, the one or more plugging characteristics of the diversion agent configured to at least limit the flow through the stable jammed structure of the first opening based upon the received candidate jamming parameters, and developing the candidate plugging parameters for the diversion agent from the determination comprises:
performing in the computing device a second phase of analysis by performing the wet analysis that receives as input at least the candidate jamming parameters;
during the second phase of analysis, identifying in the computing device optimized ones of the candidate plugging parameters based upon the data characterizing the one or more openings and the data characterizing the plurality of candidate jamming parameters; and
wherein treating the formation comprises providing a carrier fluid, wherein the carrier fluid comprises the diversion agent based upon the candidate jamming parameters and the optimized plugging parameters to divert the treatment fluid.

18. The method of claim 17, wherein the data characterizing the one or more of the plurality of degradable particle types includes degrading properties of each degradable particle type.

19. The method of claim 17, wherein one or more of the candidate jamming parameters and the optimized plugging parameters are further characterized with respect to one or more specifications of a sand screen.

20. The method of claim 17, wherein the candidate jamming parameters comprise at least one of particle size, particle shape, particle size distribution, particle mechanical properties, particle frictional properties, particle concentration, injection flow rate, and particle chemistry.

21. The method of claim 17, wherein the candidate jamming parameters are optimized at least in part by determining that the candidate jamming parameters meet a minimum stability requirement and a minimum probability of jamming.

22. The method of claim 17, wherein the optimized plugging parameters are optimized if they are predicted to support a pre-determined build-up pressure.

23. The method of claim 17, further comprising:
performing a third phase of analysis, wherein the third phase of analysis receives as input at least one of degrading properties of a plurality of the degradable particle types and one or more specifications of one or more sand screens; and
during the third phase of analysis, identifying one or more screen-safe particle parameters, wherein a screen-safe particle parameter is a parameter of a first particle type that is predicted to allow the first particle type to flow through a first sand screen after partially degrading.

24. The method of claim 17, wherein the candidate jamming parameters are further optimized with respect to degrading properties of the plurality of degradable particle types or one or more specifications of one or more sand screens.

25. The method of claim 17, wherein the optimized plugging parameters are further based upon degrading properties of the plurality of degradable particle types or one or more specifications of one or more sand screens.

26. The method of claim 17, wherein the determination in the build-up pressure analysis uses a fully coupled flow-polydiverse particle transport model.

27. A method implemented by a treatment system for treating a formation having a hydrocarbon well therein, the method comprising:

identifying, in a computing device of the treatment system, a primary fluid path in the hydrocarbon well having one or more openings to the formation;
determining, in the computing device, one or more candidate particle types of a diversion agent by (i) evaluating a plurality of particle types using a dry analysis considering at least particle interaction without fluid transport, and (ii) selecting the one or more candidate particle types based upon a probability of the evaluated particle types creating a stable jam of a first opening of the one or more openings;
determining, in the computing device, at least a particle concentration and a particle ratio for the one or more candidate particle types of the diversion agent by performing a wet analysis considering at least particle interaction with fluid transport regarding plugging the first opening using the one or more candidate particle types and data regarding the first opening;
determining, in a build-up pressure analysis, that the determined diversion agent plugging and jamming the first opening predict a build-up pressure at least meeting a breakdown pressure of the formation adjacent the first opening; and
treating the formation with pumping equipment of the treatment system by (i) providing treatment fluid in the primary fluid path, the treatment fluid comprising the diversion agent based on the candidate particle types, the particle concentration, and the particle ratio, (ii) jamming and plugging at least the first openings with the pumped diversion agent to divert the treatment fluid, and (iii) breaking down a portion of the formation adjacent the first opening with the diverted treatment fluid.

28. The method of claim 27, wherein the particle type of the candidate particle types comprises a plurality of parameters relating to a degradable polymer particle.

29. The method of claim 27, wherein the dry analysis comprises consideration of the particle-to-particle interactions under gravity, without the fluid transport.

30. The method of claim 27, wherein the wet analysis comprises consideration of physics properties regarding the movement of the candidate particles in fluid and the interaction of the candidate particles with other candidate particles and with the first opening.

31. The method of claim 27, wherein the determination in the build-up pressure analysis uses a fully coupled flow-polydiverse particle transport model.

* * * * *